(12) United States Patent
Matsuda

(10) Patent No.: US 8,736,327 B2
(45) Date of Patent: May 27, 2014

(54) TIME-TO-DIGITAL CONVERTER

(75) Inventor: Atsushi Matsuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 35 days.

(21) Appl. No.: 13/380,392

(22) PCT Filed: Jun. 24, 2009

(86) PCT No.: PCT/JP2009/002886
§ 371 (c)(1),
(2), (4) Date: Dec. 22, 2011

(87) PCT Pub. No.: WO2010/150311
PCT Pub. Date: Dec. 29, 2010

(65) Prior Publication Data
US 2012/0092052 A1 Apr. 19, 2012

(51) Int. Cl.
*H03L 7/06* (2006.01)
(52) U.S. Cl.
USPC .......................................... 327/158; 327/261
(58) Field of Classification Search
None
See application file for complete search history.

(56) References Cited

U.S. PATENT DOCUMENTS

| 7,205,924 B2 * | 4/2007 | Vemulapalli et al. ......... 341/166 |
| 7,564,284 B2 * | 7/2009 | Henzler et al. ................ 327/261 |
| 2003/0006750 A1 | 1/2003 | Roberts et al. |
| 2007/0085570 A1 | 4/2007 | Matsuta |
| 2008/0129574 A1 | 6/2008 | Choi et al. |
| 2009/0052508 A1 | 2/2009 | Takahashi |
| 2009/0102570 A1 | 4/2009 | Yoshida et al. |
| 2010/0260242 A1 * | 10/2010 | Abe et al. ...................... 375/219 |
| 2011/0148676 A1 * | 6/2011 | Waheed et al. ............... 341/131 |
| 2011/0234327 A1 * | 9/2011 | Kobayashi .................... 331/1 R |

FOREIGN PATENT DOCUMENTS

| JP | 08-082643 A | 3/1996 |
| JP | 2005-521059 A | 7/2005 |
| JP | 2007-110370 A | 4/2007 |
| JP | 2008-131659 A | 6/2008 |
| JP | 2009-021954 A | 1/2009 |
| JP | 2009-105651 A | 5/2009 |
| WO | WO 03/081266 A1 | 10/2003 |

* cited by examiner

*Primary Examiner* — Cassandra Cox
(74) *Attorney, Agent, or Firm* — Arent Fox LLP

(57) ABSTRACT

A TDC circuit include: a first delay circuit having first inverting delay devices connected to form a loop, the first inverting delay devices outputting a inverted signal according to an input signal after a first signal delay period; a second delay circuit having second inverting delay devices connected to form a loop, the second inverting delay according to an input signal after a second signal delay period different from the first signal delay period; first flip-flop circuits that latch the logical values of third pulse signals including the first pulse signal output from the first inverting delay devices based on fourth pulse signals including the second pulse signal or pulse signals; a first counter that counts the third pulse signal; a second counter that counts the fourth pulse signal; and a detection result output circuit that stores the count from the first counter and the count from the second counter.

12 Claims, 9 Drawing Sheets

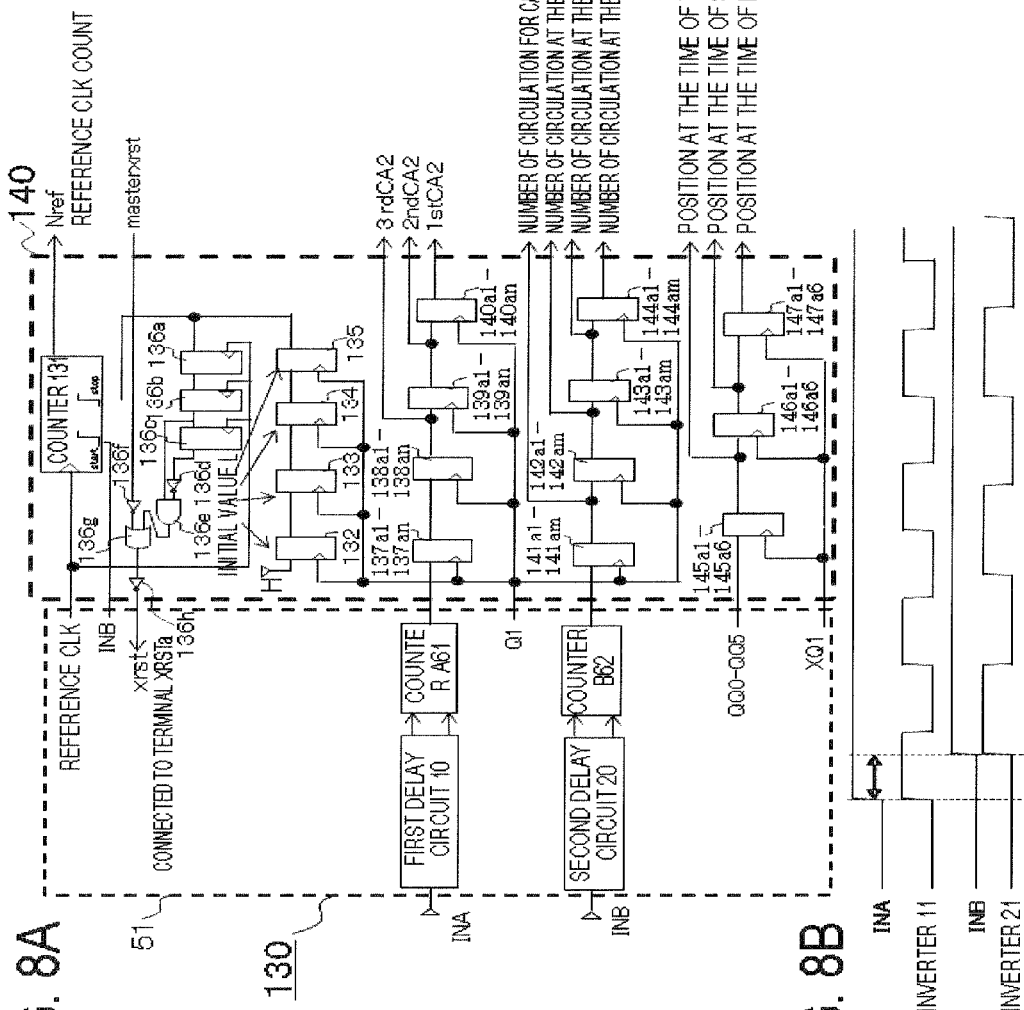

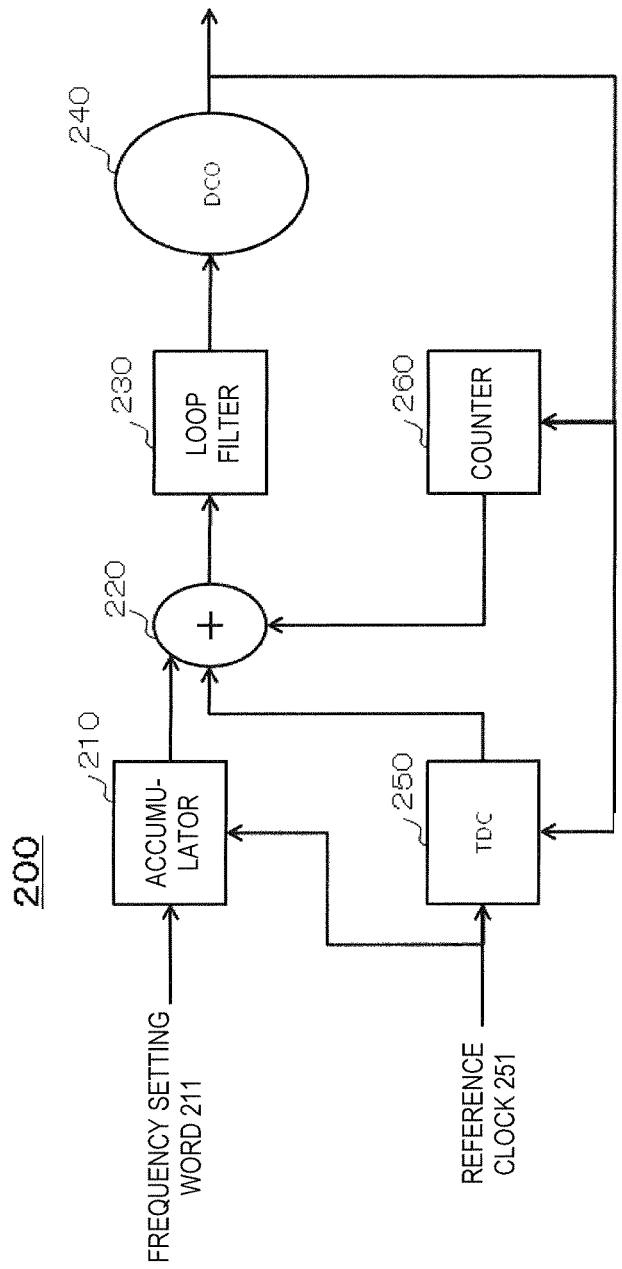

TIME-TO-DIGITAL CONVERTER

CROSS REFERENCE TO RELATED APPLICATION

This application is based upon and claims the benefit of priority from the International application NO. PCT/JP2009/002886 filed on Jun. 24, 2009, and the prior Japanese Patent Application No. 2011-519311 filed on Sep. 5, 2011, the entire contents of which are incorporated herein by reference.

FIELD

The embodiments disclosed hereafter are related to a circuit that measures time difference by using pulse signals.

BACKGROUND

In a wireless communication apparatus, an RF circuit is formed of an analog circuit, and a baseband circuit is formed of a digital circuit in related art. An analog circuit occupies a large area and consumes a large amount of electric power. To address the problems, an RF circuit formed of a digital circuit has been studied, and an ADPLL (all digital phase locked loop) circuit corresponding to a PLL (phase locked loop) circuit, which plays an important role in processing an RF signal, has been proposed.

In an ADPLL circuit, a challenge is increasing the resolution of a TDC (time-to-digital converter) circuit that detects phase difference between two different clocks, that is, time difference between logical value rising edges of two pulse signals, and expresses the difference in a digital value.

The time difference between logical value rising edges of two pulse signals is detected as follows: First, one of the pulse signals is input to a delay circuit formed of a plurality of logic circuits connected in series so that the pulse signal propagates through the delay circuit. The other pulse signal is also input with time difference to another delay circuit formed of logic circuits connected in series so that the pulse signal propagates through the delay circuit. It is noted that each of the logic circuits in the latter delay circuit produces a signal delay period shorter than that produced in each of the logic circuits in the former delay circuit. The time difference described above may be determined by locating the logic circuits where the rising edge of the one pulse signal propagating through the former delay circuit coincides with the rising edge of the other pulse signal propagating through the latter delay circuit, because the time difference is equal to the product of the following two values: one is the difference between the signal delay period produced in the logic circuit through which the one pulse signal propagates and the signal delay period produced in the logic circuit through which the other pulse signal propagates, and the other is the number of logic circuits counted from the first one to the one where the rising edges coincides with each other.

In a TDC circuit, when series-connected logic circuits are used to form each delay circuit through which two pulse signals propagate so that the time difference therebetween is detected, large-scale delay circuits are requested.

To reduce the scale of the delay circuits, each of the delay circuits is formed by connecting an odd number of logic circuits each of which outputs an inverted logical value to form a loop so that a pulse signal propagates continuously (see National Publication of International Patent Application No. 2005-521059). When loop-shaped delay circuits are each formed of a small number of logic circuits each of which outputs an inverted logical value, the product of two values, one is the difference between the pulse cycle of an oscillatory clock produced by one pulse signal in one of the loop-shaped delay circuits and the pulse cycle of an oscillatory clock produced by the other pulse signal in the other loop-shaped delay circuit, and the other is the clock count at the time when the rising edges of the two oscillatory clocks coincide with each other, is equal to the time difference between the time when the one pulse signal is input and the time when the other pulse signal is input.

The difference in cycle between the oscillatory clocks is formed by changing the signal delay periods produced in the loop-shaped delay circuits because the cycle of each of the oscillatory clocks is determined in accordance with the sum of signal delay periods produced in the plurality of delay circuits. It is therefore difficult to reduce the difference in cycle between the oscillatory clocks unless the change in signal delay period is very small.

Further, since a rising edge of one oscillatory clock is used to detect a rising edge of the other oscillatory clock, the difference in cycle between the oscillatory clocks may not be smaller than the reaction time of a flip-flop circuit. Since the time difference between input signals is detected based on the time difference in cycle between the two oscillatory clocks, the detection precision is not improved.

The reason why rising edges of the two oscillatory clocks are used to detect the time difference between the input signals follows: In each loop-shaped delay circuit in which an oscillatory clock signal is produced, look at a single logic circuit that outputs an inverted logical value (inverter, for example). Since the loop-shaped delay circuit is formed of an odd number of inverters, the logical value of the signal output from the inverter of interest keeps rising and falling. The period from a rising edge of the logical value to a falling edge thereof is, however, not always one-half a single cycle. In this case, the difference between rising edges of the two oscillatory clocks may not be detected based on a rising edge of one of the oscillatory clocks and a falling edge of the other oscillatory clock.

As described above, it is difficult to improve the resolution of a TDC circuit for detecting the time difference by using delay circuits each of which is formed by connecting logic circuits each of which outputs an inverted logical value to form a loop.

SUMMARY

An object of the present invention is to provide a TDC circuit that precisely detects the time difference between the time when one input signal is input and the time when the other input signal is input by using a delay circuit through which a pulse signal resulting from the one input signal propagates and a delay circuit through which a pulse signal resulting from the other input signal propagates.

To achieve the object described above, there is provided a TDC circuit including a first delay circuit having an even number of first inverting delay devices connected in series to form a loop, each of the first inverting delay devices outputting a signal having a logical value inverted from the logical value of an input signal after a first signal delay period, a second delay circuit having the same even number of second inverting delay devices connected in series to form a loop as that of the first inverting delay devices, each of the second inverting delay devices outputting a signal having a logical value inverted from the logical value of an input signal after a second signal delay period different from the first signal delay period, a first pulse signal drive circuit that receives a first input signal and causes any of the first inverting delay devices to produce a first pulse signal, a second pulse signal drive circuit that receives a second input signal and causes any of the second inverting delay devices to produce a second pulse signal, a plurality of first flip-flop circuits that latch the logical values of third pulse signals including the first pulse signal output from the first inverting delay devices corresponding to the second inverting delay devices or pulse signals produced by the first inverting delay devices in response to the first pulse signal based on fourth pulse signals including the second pulse signal or pulse signals produced by the second inverting delay devices in response to the second pulse signal, a first counter that counts the third pulse signal produced by any one of the first inverting delay devices, a second counter that counts the fourth pulse signal produced by any one of the second inverting delay devices, and a detection result output circuit that, when the plurality of first flip-flop circuits latch the third pulse signals based on the fourth pulse signals and the logical value of the signal latched by any of the plurality of first flip-flop circuits changes from "L" to "H", stores the count from the first counter and the count from the second counter.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF THE DRAWINGS

FIGS. 8A and 8B are a circuit diagram and an operation descriptive diagram of a TDC circuit 130 according to a second embodiment; and FIG. 9 is a circuit diagram of an ADPLL 200 according to a third embodiment.

DESCRIPTION OF THE PREFERRED EMBODIMENTS

The present invention not only encompasses embodiments described below but also those obtained by making design changes that may occur to the skilled in the art to the embodiments and those obtained by reconfiguring components employed in the embodiments. The present invention further encompasses those obtained by replacing components employed in the embodiments with other components that achieve the same effects. That is, the present invention is not limited to the embodiments described below.

First Embodiment

Figure 1:
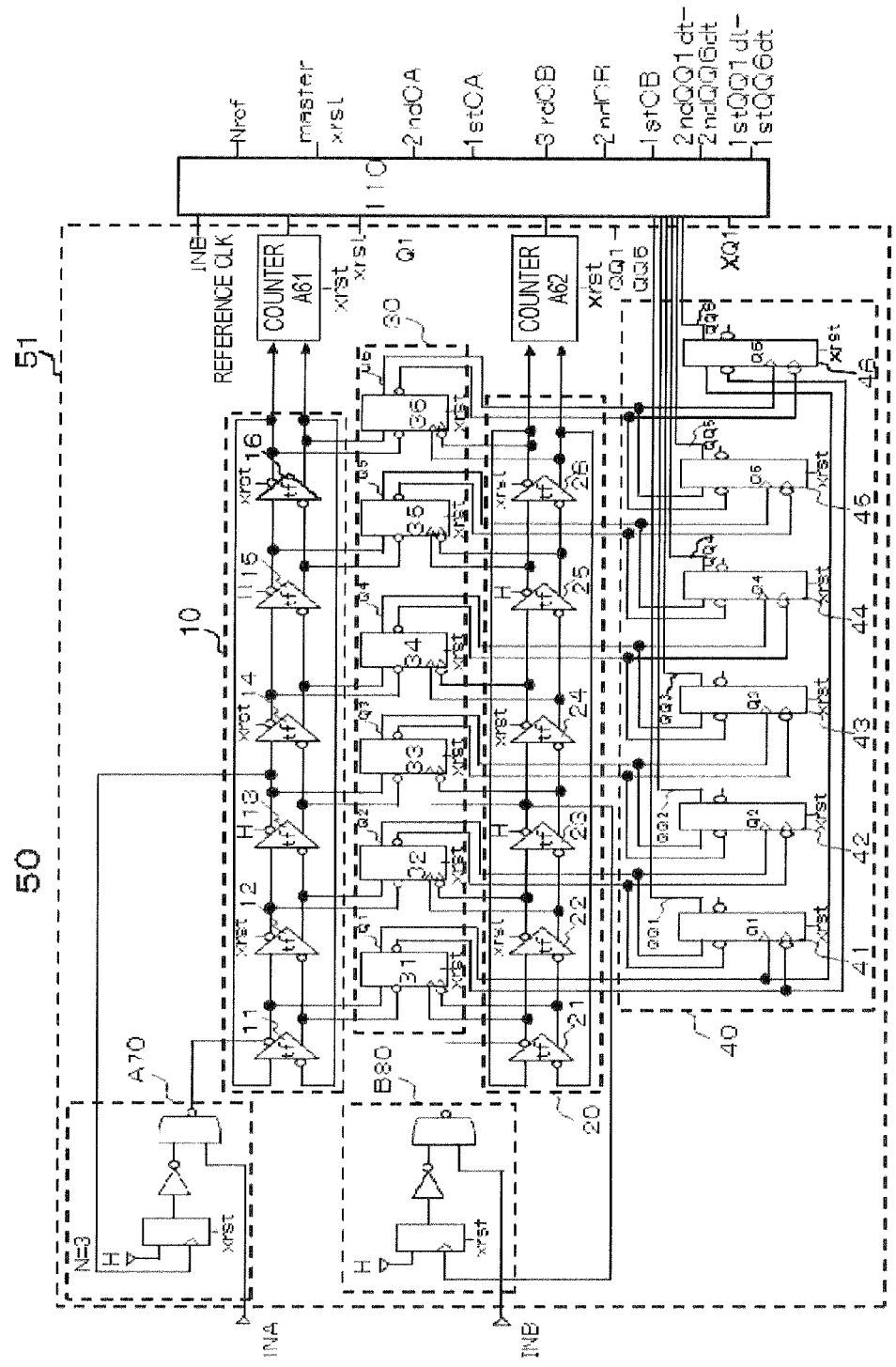
FIG. 1 depicts a TDC circuit 50 according to a first embodiment.

FIG. 1 depicts a TDC circuit 50 according to a first embodiment. The TDC circuit 50 includes an edge detection circuit 51 and a detection result output circuit 110. The TDC circuit 50 according to the first embodiment receives input signals INA and INB input at different timings and measures the time difference between the input signals when the time difference therebetween is positive. The positive time difference used herein means that the input signal INA is input after the input signal INB is input.

The edge detection circuit 51 includes a first delay circuit 10, a second delay circuit 20, a first flip-flop column 30, a second flip-flop column, 40, a counter A61, a counter B62, a pulse width setting circuit A70, and a pulse width setting circuit B80.

The first delay circuit 10 includes an inverter 11, an inverter 12, an inverter 13, an inverter 14, an inverter 15, and an inverter 16. An output signal from the inverter 11 is received by the inverter 12. An output signal from the inverter 12 is received by the inverter 13. An output signal from the inverter 13 is received by the inverter 14. An output signal from the inverter 14 is received by the inverter 15. An output signal from the inverter 15 is received by the inverter 16. An output signal from the inverter 16 is received by the inverter 11. That is, the inverters 11, 12, 13, 14, 15, and 16 are connected in series to form a ring. Signal delay periods from the timing when input signals are input to the inverters 11, 12, 13, 14, 15, and 16 to the timing when output signals are output therefrom are desirably substantially equal to one another. The first delay circuit 10 is not necessarily formed of the six inverters as described above but may be formed of any even number of inverters. Further, pulse signals temporally apart from each other by Tf are continuously produced in the first delay circuit 10, as will be described later.

The inverter 11 has an input terminal XRSTa. The inverter 11 receives two complementary input signals and outputs complementary output signals having logical values inverted from those of the input signals when a signal having a logical value "H" is input to the input terminal XRSTa. When a signal having a logical value "L" is input to the input terminal XRSTa, the inverter 11 outputs output signals, one having the logical value "H" and the other having the logical value "L", irrespective of input signals. An inverter that forms the inverter 11 will be described later in detail with reference to FIG. 2.

The inverters 12, 13, 14, 15, and 16 function in the same manner the inverter 11 does.

The second delay circuit 20 includes an inverter 21, an inverter 22, an inverter 23, an inverter 24, an inverter 25, and an inverter 26. The inverters 21, 22, 23, 24, 25, and 26 are connected in series to form a ring. The second delay circuit 20 is not necessarily formed of the six inverters but may be formed of any even number of inverters. It is, however, noted that the number of inverters that form the second delay circuit 20 is equal to the number of inverters that form the first delay circuit 10. Signal delay periods from the timing when input signals are input to the inverters 21, 22, 23, 24, 25, and 26 to the timing when output signals are output therefrom are desirably substantially equal to one another. The signal delay periods produced in the inverters 21, 22, 23, 24, 25, and 26 are longer than those produced in the inverters 11, 12, 13, 14, 15, and 16. The inverters 21, 22, 23, 24, 25, and 26 also function in the same manner as the inverter 11 does. Pulse signals temporally apart from each other by Ts are continuously produced in the second delay circuit 20, as will be described later. The interval Ts is longer than the interval Tf between the pulse signals produced in the first delay circuit 10. The reason why the time interval between the pulse signals in the first delay circuit 10 differs from the time interval between the pulse signals in the second delay circuit 20 is that the signal delay periods produced in the inverters that form the two delay circuits differ from each other and hence the period requested for a signal to propagate the six inverters, that is, the period that determines a single cycle, differs between the two delay circuits.

The first flip-flop column 30 includes a flip-flop circuit 31, a flip-flop circuit 32, a flip-flop circuit 33, a flip-flop circuit 34, a flip-flop circuit 35, and a flip-flop circuit 36. The flip-flop circuit 31 is a D flip-flop circuit that has a D (data) terminal, a CLK (clock) terminal, and a Q (output data) terminal and latches the logical value of an input signal to the D terminal and outputs the latched signal as an output signal through the Q terminal when the logical value of an input signal to the CLK terminal rises from "L" to "H". Each of the D terminal, the Q terminal, and the CLK terminal of the D flip-flop circuit described above has a function of receiving complementary signals. That is, the D terminal is formed of the D terminal and an XD terminal, the Q terminal is formed of the Q terminal and an XQ terminal, and the CLK terminal is formed of the CLK terminal and an XCLK terminal.

Each of the flip-flop circuits 32, 33, 34, 35, and 36 is also a D flip-flop circuit of the same type.

The flip-flop circuit 31 receives through the D terminal thereof output signals from the inverter 11, receives through the CLK terminal thereof output signals from the inverter 21, and outputs output signals through the Q terminal thereof to the CLK terminal of a flip-flop circuit 41 and the D terminal of a flip-flop circuit 46.

The flip-flop circuit 32 receives through the D terminal thereof output signals from the inverter 12, receives through the CLK terminal thereof output signals from the inverter 22, and outputs output signals through the Q terminal thereof to the CLK terminal of a flip-flop circuit 42 and the D terminal of the flip-flop circuit 41.

The flip-flop circuit 33 receives through the D terminal thereof output signals from the inverter 13, receives through the CLK terminal thereof output signals from the inverter 23, and outputs output signals through the Q terminal thereof to the CLK terminal of a flip-flop circuit 43 and the D terminal of the flip-flop circuit 42.

The flip-flop circuit 34 receives through the D terminal thereof output signals from the inverter 14, receives through the CLK terminal thereof output signals from the inverter 24, and outputs output signals through the Q terminal thereof to the CLK terminal of a flip-flop circuit 44 and the D terminal of the flip-flop circuit 43.

The flip-flop circuit 35 receives through the D terminal thereof output signals from the inverter 15, receives through the CLK terminal thereof output signals from the inverter 25, and outputs output signals through the Q terminal thereof to the CLK terminal of a flip-flop circuit 45 and the D terminal of the flip-flop circuit 44.

The flip-flop circuit 36 receives through the D terminal thereof output signals from the inverter 16, receives through the CLK terminal thereof output signals from the inverter 26, and outputs output signals through the Q terminal thereof to the CLK terminal of the flip-flop circuit 46 and the D terminal of the flip-flop circuit 45.

The flip-flop circuits 31 to 36 are reset by a signal Xrst.

The second flip-flop column 40 includes the flip-flop circuit 41, the flip-flop circuit 42, the flip-flop circuit 43, the flip-flop circuit 44, the flip-flop circuit 45, and the flip-flop circuit 46. The flip-flop circuits 41 to 46 are reset by the signal Xrst. Each of the flip-flop circuits 41, 42, 43, 44, 45, and 46 is a D flip-flop circuit of the same type as the flip-flop circuit 31. Input signals to the D terminals and the CLK terminals of the flip-flop circuits 41, 42, 43, 44, 45, and 46 are the output signals from the flip-flop circuits 31, 32, 33, 34, 35, and 36. These input signals have been described above in detail and will therefore not be described again. The operation of the first flip-flop column 30 and the second flip-flop column 40 will be described with reference to FIG. 5.

The counter A61 receives complementary signals output from the inverter 16 and increments its count when the logical value of the positive-logic signal rises from "L" to "H".

The counter B62 receives complementary signals output from the inverter 26 and increments its count when the logical value of the positive-logic signal rises from "L" to "H".

The pulse width setting circuit A70 includes a flip-flop circuit 71, an inverter 72, a NAND circuit 73, and an input terminal to which the signal INA is input.

A signal having the logical value "H" is input to the D terminal of the flip-flop circuit 71. The signal output from the inverter 13 is input to the CLK terminal of the flip-flop circuit 71.

An output signal output through the Q terminal of the flip-flop circuit 71 is input to the inverter 72.

An output signal from the inverter 72 is input to one of the input terminals of the NAND circuit 73. The signal INA is input to the other input terminal of the NAND circuit 73. An output signal from the NAND circuit 73 is input to the input terminal XRSTa of the inverter 11.

The operation of the pulse width setting circuit A70 will be described later in detail with reference to FIG. 3.

The pulse width setting circuit B80 includes a flip-flop circuit 81, an inverter 82, a NAND circuit 83, and an input terminal to which the signal INB is input.

A signal having the logical value "H" is input to the D terminal of the flip-flop circuit 81. The signal output from the inverter 23 is input to the CLK terminal of the flip-flop circuit 81.

An output signal output through the Q terminal of the flip-flop circuit 81 is input to the inverter 82.

An output signal from the inverter 82 is input to one of the input terminals of the NAND circuit 83. The signal INB is input to the other input terminal of the NAND circuit 83. An output signal from the NAND circuit 83 is input to the input terminal XRSTa of the inverter 21.

The detection result output circuit 110 receives the following input signals: n signals (n is a positive integer) corresponding to the bits that express the binary count from the counter A61, m signals (m is a positive integer) corresponding to the bits that express the binary count from the counter B62, a reference CLK (reference clock), the signal INB used as a count start edge signal, a signal Q1 through the Q terminal of the flip-flop circuit 32, and signals QQ1, QQ2, QQ3, QQ4, QQ5, and QQ6 through the Q terminals of the flip-flop circuits 41, 42, 43, 44, 45, and 46. The detection result output circuit 110 outputs s (s is a positive integer) signals having logical values corresponding to the bits that express a binary count Nref of the reference CLK (reference clock), the signal Xrst to the first delay circuit 10 and the second delay circuit 20, a plurality of signals having logical values corresponding to the bits that express the binary number of circulation 1stCA output from the counter A61 at the time of first detection, a plurality of signals having logical values corresponding to the bits that express the binary number of circulation 2ndCA output from the counter A61 at the time of second detection, a plurality of signals having logical values corresponding to the bits that express the binary number of circulation 1stCB output from the counter B62 at the time of first detection, a plurality of signals having logical values corresponding to the bits that express the binary number of circulation 2ndCB output from the counter B62 at the time of second detection, a plurality of signals having logical values corresponding to the bits that express the binary number of circulation for calibration 3irdCB output from the counter B62 at the time of third detection, signals having logical values corresponding to the bits that express the binary number representing the inverter associated with the time of first detection among the inverters (1stQQ1dt to 1stQQ6dt), and signals having logical values corresponding to the bits that express the binary number representing the inverter associated with the time of second detection among the inverters (2ndQQ1dt to 2ndQQ6dt).

That is, the detection result output circuit 110 produces binary values requested to determine by using Expression (1), (2), (3) and (4), which will be described later, the time difference between the signal INA and the signal INB based on the signals from the counter A61, the counter B62, the flip-flop circuit 32, the flip-flop circuits 41, 42, 43, 44, 45, and 46. The operation of the detection result output circuit 110 will be described in detail with reference to FIG. 7.

Figure 2:
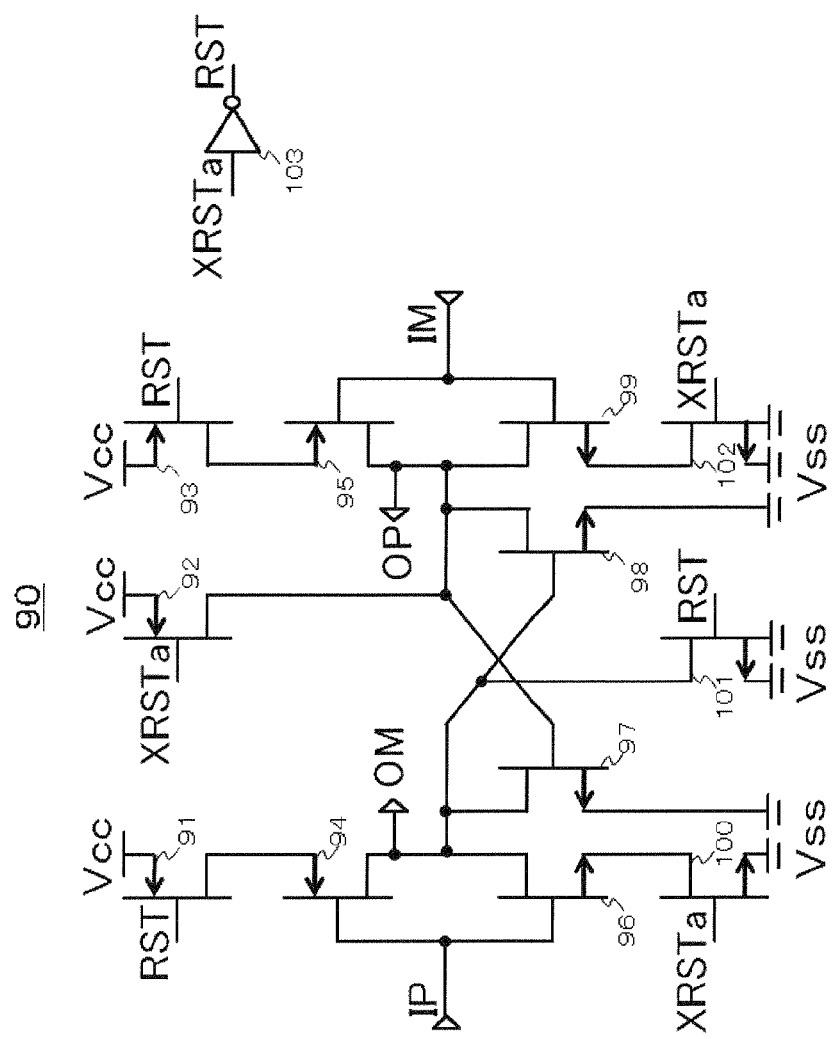
FIG. 2 is a circuit diagram of an inverter 90 that forms an inverter 11.

FIG. 2 is a circuit diagram of an inverter 90 that forms the inverter 11. The inverter 90 includes P-MOS transistors 91, 92, 93, 94, and 95 and N-MOS transistors 96, 97, 98, 99, 100, 101, and 102.

The P-MOS transistor 91 has a source connected to a high potential power supply Vcc, a drain connected to the source of the P-MOS transistor 94, and a gate that receives a signal RST.

The P-MOS transistor 92 has a source connected to the high potential power supply Vcc, a drain connected to the drain of the N-MOS transistor 98, and a gate connected to the input terminal XRSTa, which receives the input signal Xrst. The drain of the N-MOS transistor 98 is connected to an output signal terminal OP, the drain of the P-MOS transistor 95, the drain of the N-MOS transistor 99, and the gate of the N-MOS transistor 97.

The P-MOS transistor 93 has a source connected to the high potential power supply Vcc, a drain connected to the source of the P-MOS transistor 95, and a gate that receives the signal RST.

The P-MOS transistor 94 has a source connected to the drain of the P-MOS transistor 91, a drain connected to the drain of the N-MOS transistor 96, and a gate connected to an input signal terminal IP. The drain of the N-MOS transistor 96 is connected to an output signal terminal OM, the drain of the N-MOS transistor 101, the drain of the N-MOS transistor 97, and the gate of the N-MOS transistor 98.

The P-MOS transistor 95 has a source connected to the drain of the P-MOS transistor 93, a drain connected to the drain of the N-MOS transistor 99, and a gate connected to an input signal terminal IM.

The N-MOS transistor 96 has a source connected to the drain of the N-MOS transistor 100, a drain connected to the drain of the P-MOS transistor 94, and a gate connected to the input signal terminal IP.

The N-MOS transistor 97 has a drain connected to the drain of the P-MOS transistor 94, a source connected to a ground potential Vss, and a gate connected to the drain of the P-MOS transistor 92.

The N-MOS transistor 98 has a drain connected to the drain of the P-MOS transistor 95, a source connected to the ground potential Vss, and a gate connected to the drain of the N-MOS transistor 101.

The N-MOS transistor 99 has a drain connected to the drain of the P-MOS transistor 95, a source connected to the N-MOS transistor 102, and a gate connected to the input signal terminal IM.

The N-MOS transistor 100 has a drain connected to the source of the N-MOS transistor 96, a source connected to the ground potential Vss, and a gate connected to the input terminal XRSTa.

The N-MOS transistor 101 has a drain connected to the drain of the N-MOS transistor 96, a source connected to the ground potential Vss, and a gate that receives the signal RST.

The N-MOS transistor 102 has a drain connected to the source of the N-MOS transistor 99, a source connected to the ground potential Vss, and a gate connected to the input terminal XRSTa.

An inverter 103 receives the input signal Xrst through the input terminal XRSTa and outputs the signal RST having a logical value inverted from that of the input signal Xrst.

In this configuration, the inverter 90 receives complementary signals through the input terminals IP and IM and outputs output signals having logical values inverted from those of the input signals through the output terminals OP and OM when the input signal Xrst has the logical value "H", because the P-MOS transistors 91 and 93 supply the P-MOS transistors 94 and 95 with the high voltage Vcc, and the N-MOS transistors 100 and 102 supply the N-MOS transistors 96 and 99 with the ground potential Vss. When the input signal Xrst has the logical value "L", the inverter 90 outputs a signal having the logical value "L" through the output terminal OM and outputs a signal having the logical value "H" through the output terminal OP irrespective of the logical values of the signals input through the input terminals IP and IM.

Figure 3:
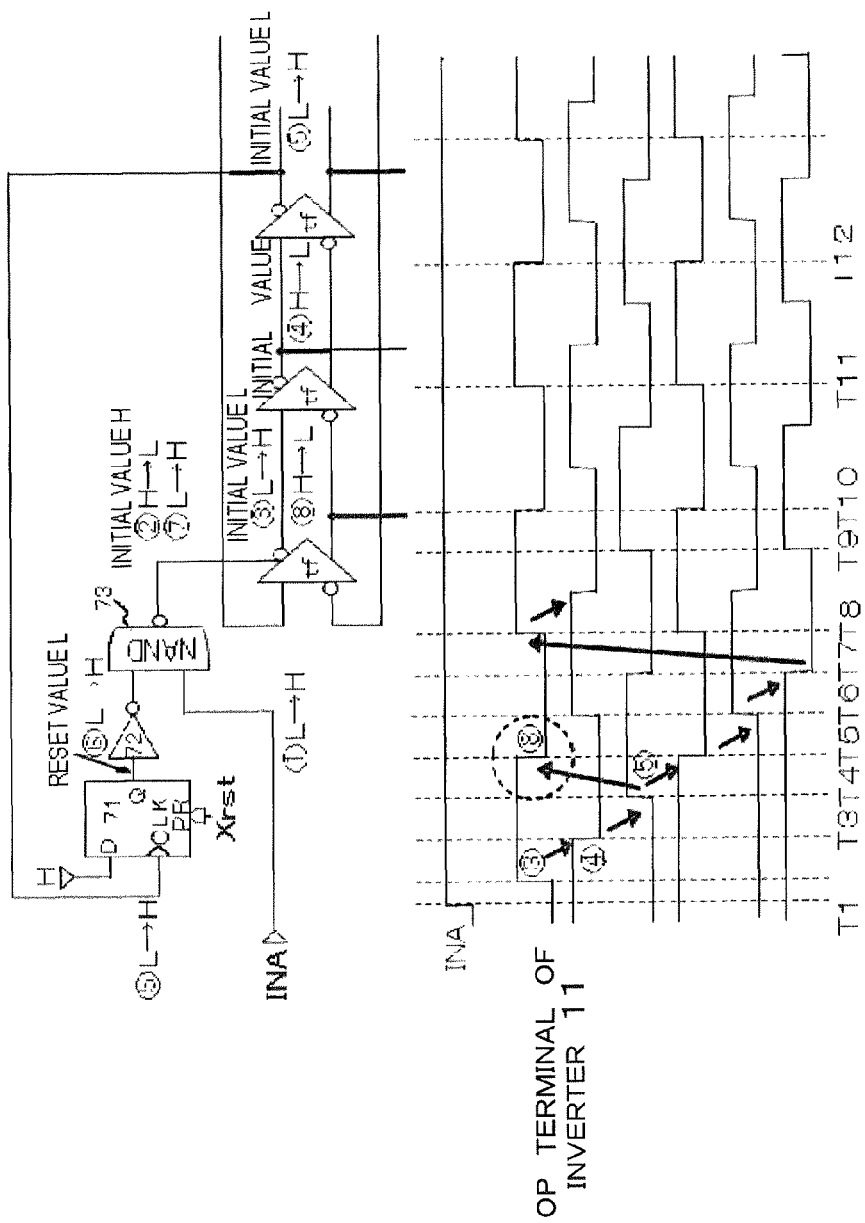
FIG. 3 describes the operation of a pulse width setting circuit A70.

FIG. 3 describes the operation of the pulse width setting circuit A70. The pulse width setting circuit B80 operates in the same manner as the pulse width setting circuit A70 does.

The signal INA is input to one of the input terminals of the NAND circuit 73. The logical value of the signal INA rises from "L" to "H" at time T1.

An initial value at the Q terminal of the flip-flop circuit 71 is "L".

The inverter 72 receives the signal output through the Q terminal of the flip-flop circuit 71, inverts the logical value of the signal, and outputs the resultant signal.

The NAND circuit 73 performs AND operation between the signal input through one of the terminals thereof and the signal input through the other terminal, inverts the logical value of the signal having undergone the AND operation, and outputs the resultant signal to the input terminal XRSTa of the inverter 11. The inverter 72 then outputs a signal having the logical value "H" at time T2. Since the signal INA has the logical value "H", the logical value of the signal output from NAND circuit 73 to the inverter 11 changes from the "H" to "L".

Before the time T1, a period when the input terminal XRSTa receives the signal having the logical value "H", the inverter 11 outputs through the output terminal OP a signal having a logical value inverted from that of the input signal. That is, before the time T1, the inverter 11 outputs a signal having the logic "H". When receiving a signal having the logical value "L" through the input terminal XRSTa at the time T1, the inverter 11 outputs a signal having the logical value "H" through the output terminal OP irrespective of the logical value of the input signal.

The inverter 12 then receives the signal having the logical value "H" output through the output terminal OP of the inverter 11 and outputs a signal having the logical value "L" through the output terminal OP at time T3.

The inverter 13 then receives the signal having the logical value "L" output through the output terminal OP of the inverter 12 and outputs a signal having the logical value "H" through the output terminal OP at time T4.

A signal having the logical value "H" is input to the input terminal XRSTa of each of the inverters 13 and 15. Further, the signal Xrst output from the detection result output circuit 110 is supplied to the input terminal XRSTa of each of the inverters 12, 14, and 16. The logical value of the signal Xrst is "H" at the time of first and second detection but is changed to "L" after the third detection.

When the logical value of the signal through the output terminal OP of the inverter 13 rises from "L" to "H" at the time T4, the logical value at the CLK terminal of the flip-flop circuit 71 rises, and the logical value of the signal output through the Q terminal of the flip-flop circuit 71 rises from "L" to "H". The logical value of the signal output from the inverter 72 then falls from "H" to "L", and the logical value of the signal output from the NAND circuit 73 rises from "L" to "H".

As a result, the inverter 11 receives a signal having the logical value "H" through the input terminal XRSTa and outputs a signal having a logical value inverted from that of an input signal. That is, the inverter 11 outputs a signal having the logical value "L" at time T5.

At this point, if the signal Xrst having the logical value "H" is not input to the input terminal XRSTa of the inverter 11, the logical value of the output signal from the inverter 16, that is, the logical value of the input signal to the inverter 11, becomes "L" at time T7, which causes the inverter 11 to keep outputting the signal having the logical value "H". As a result, since the number of inverters 11 to 16 is six, the signal output from each of the inverters 11 to 16 has a fixed logical value.

However, if the inverter 11 receives a signal having the logical value "H" through the input terminal XRSTa at the time T5, that is, before the logical value of the signal from the inverter 16 changes to "L", and the logical value of the output signal from the inverter 11 changes, the change in logical value of the signal from the inverter 11 that occurred at the time T2 is followed by the change in logical value of the signal from the inverter 11 that occurred at the time T5, and the changes propagate through the inverter column (inverters 11 to 16). As a result, even when the inverter column is formed of an even number of inverters connected to form a loop, each of the inverters in the inverter column outputs a signal that does not have a fixed logical value.

The inverter 16 outputs through the output terminal OP a signal having a logical value rising from "L" to "H" at time T9, because the signal having the logical value "L" output from the inverter 11 at the time T5 has propagated. The counter circuit A61 then increments its count when the logical value of the signal output through the output terminal OP of the inverter 16 rises from "L" to the "H".

Thereafter, since the inverters 11 to 16 repeatedly operate as described above, pulse signals are repeatedly output through the output terminals OP and OM of the inverter 11. As a result, the inverters 11 to 16 produce clock signals depicted in the periods from T8 to T9 and from T9 to T10. The logical values of the thus produced clock signals repeatedly change between "H" and "L" at a fixed cycle determined by a signal propagation period requested for a signal to propagate from the inverters 11 to 16. Further, the period during which the logical value "H" of the signals output through the output terminals OP and OM of the inverter 11 is maintained is determined by the period requested for a signal to propagate through the inverters 11 to 13 and the pulse width setting circuit A70. As a result, since the number of inverters that determines the period during which the logical value "H" described above is maintained is one-half the number of inverters that determine the period of one cycle, the period during which the logical value "H" of the signals output from the inverter 11 is maintained is substantially equal to the period during which the logical value "L" of the signals output from the inverter 11 is maintained.

As described above, the first delay circuit 10 produces pulse signals temporally apart from each other by the period from T10 to T12, that is, Tf, and formed of pulses each of which has a width about one-half the period from T10 to T12. Similarly, the second delay circuit 20 also produces pulse signals temporally apart from each other by Ts and formed of pulses each of which has a width about one-half the period Ts.

Figure 4:
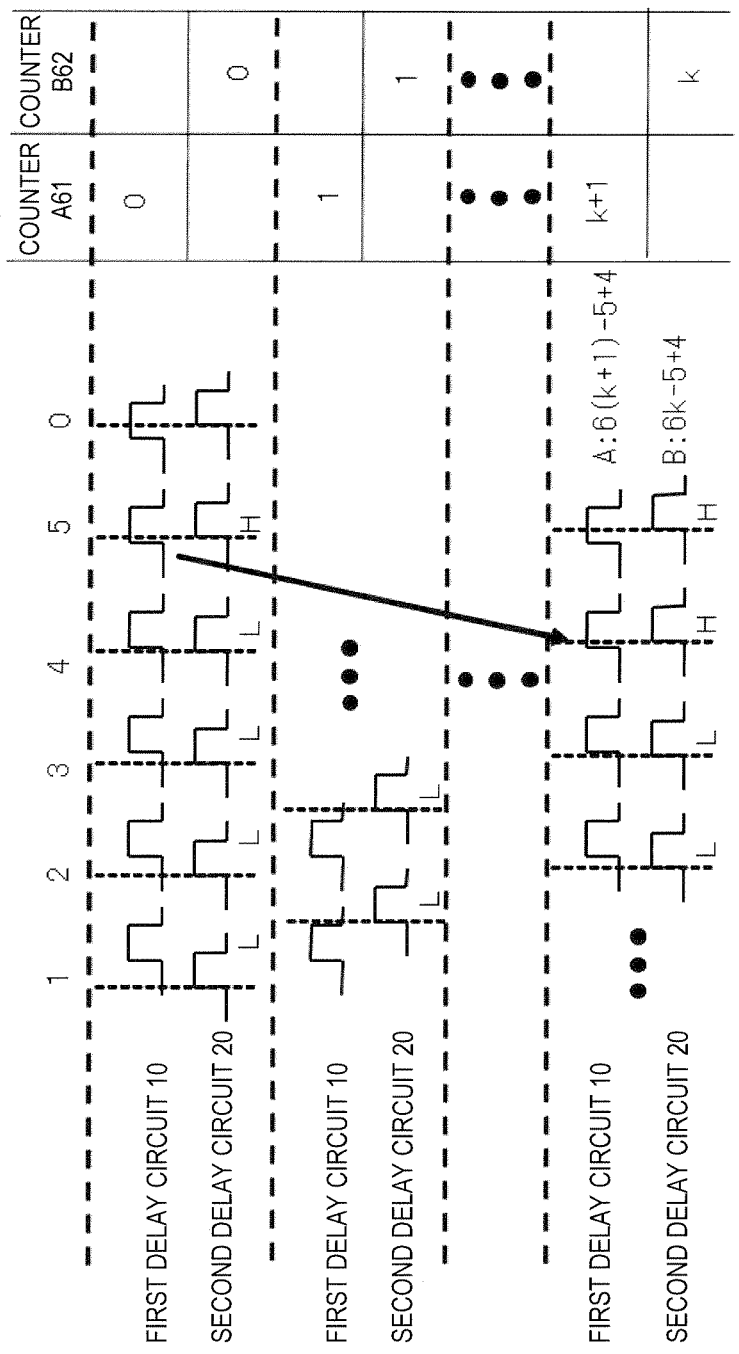
FIG. 4 describes the principle based on which the TDC circuit 50 measures a time interval.

FIG. 4 describes the principle based on which the TDC circuit 50 measures the temporal interval. The description of the measurement principle will be made with reference to measurement of the time interval between the falling edge of the input signal INA to the first delay circuit 10 from the logical value "H" to "L" and the falling edge of the input signal INB to the second delay circuit 20 from the logical value "H" to "L".

The pulse signal formed of pulses temporally apart from each other by Tf output from the inverter 11, which forms the first delay circuit 10, produces a clock signal having a cycle Tf in the first delay circuit 10, as depicted in FIG. 4. Further, the pulse signal output from the inverter 21, which forms the second delay circuit 20, causes a pulse signal having a cycle Ts to propagate through the second delay circuit 20.

It is now assumed that after the logical value of the input signal INA rises from "H" to "L" and a certain amount of time elapses, the logical value of the input signal INB rises from "H" to "L", as depicted in the first stage in FIG. 4. It is also assumed that when the count of each of the counter A61 and the counter B62 is zero, that is, in the period before the pulse signals produced when the input signals INA and INB are input reach the counter circuits A61 and B62, the time when the fourth inverter 14 outputs a pulse signal is later than the time when the fourth inverter 24 outputs a pulse signal, and that the time when the fifth inverter 15 outputs a pulse signal is earlier than the time when the fifth inverter 25 outputs a pulse signal. That is, it is assumed that since the interval between the pulse signals traveling through the second delay circuit 20 is longer, the timing at which the pulse signal traveling through the first delay circuit 10 is produced and the timing at which the pulse signal traveling through the second delay circuit 20 is produced are reversed between the fourth and fifth inverters in the first pulse signal circulation.

Thereafter, when the count of each of the counter circuit A61 and the counter circuit B62 is one, that is, when the pulse signals produced in the first delay circuit 10 and the second delay circuit 20 are in the first circulation, the pulse signals in the first delay circuit 10 rise gradually earlier than the pulse signals in the second delay circuit 20, as depicted in the following stage in FIG. 4. The reason for this is that the interval between the pulse signals in the second delay circuit 20 is longer.

It is then assumed that when the count of the counter circuit A61 is (k+1) and the count of the counter circuit B62 is k, that is, when the pulse signals produced when the input signals INA and INB are input enter the (k+1)-th circulation in the counter circuit A61 and the k-th circulation in the counter circuit B62, respectively, the time when the third inverter 13 outputs a pulse signal is later than the time when the third inverter 23 outputs a pulse signal, and the time when the fourth inverter 14 outputs a pulse signal is earlier than the time when the fourth inverter 24 outputs a pulse signal, as depicted in the last stage in FIG. 4. That is, it is assumed that when the pulse signals in the first delay circuit 10 are in the k-th circulation, the pulse signal traveling through the first delay circuit 10 rises earlier than the pulse signal traveling through the second delay circuit 20 between the third and fourth inverters.

Now, let Tf be the interval between the pulse signals in the first delay circuit 10 and Ts be the interval between the pulse signals in the second delay circuit 20. Further, consider a situation where the pulse signal having already circulated C times and traveling through a certain inverter in the first delay circuit 10 rises for the first time earlier than the pulse signal traveling through the corresponding inverter in the second delay circuit 20 because the interval Ts between the pulse signals in the second delay circuit 20 is longer. In this situation, let A be the position of the inverter among the inverters in the first delay circuit 10 where the above situation occurs. Further, consider another situation where the pulse signal having already circulated D times and traveling through a certain inverter in the first delay circuit 10 rises for the second time earlier than the pulse signal traveling through the corresponding inverter in the second delay circuit 20. In this situation, let B be the position of the inverter among the inverters in the first delay circuit 10 where the above situation occurs. To allow the pulse signal produced by a certain inverter in the first delay circuit 10 rises earlier than the pulse signal produced in the corresponding inverter in the second delay circuit 20 considering that the interval between the pulse signals produced in the inverters in the second delay circuit 20 is longer, the number of circulation of the pulse signal in the first delay circuit 10 needs to be greater by one than the number of the circulation of the pulse signal in the second delay circuit 20. In this case, the following expression (1) is satisfied:

$$(6k-A+B)Ts=(6(k+1)-A+B)Tf \quad \text{Expression (1)}$$

where k=(D−C).

When Tf=Ts−Δt, Expression (2) is derived from Expression (1).

$$(6k-A+B)Ts=(6(k+1)-A+B)\times(Ts-\Delta t) \quad \text{Expression (2)}$$

Expression (3) is then derived.

$$\Delta t=6Ts/(6k+6-A+B) \quad \text{Expression (3)}$$

Further, the time difference TT between the time when the logical value of the input signal INA rises and the time when the logical value of the input signal INB rises is expressed by the following expression:

$$TT=A\times\Delta t \quad \text{Expression (4)}$$

In the actual example described above, after the pulse signal traveling through the fifth inverter in the first delay circuit 10 in the first circulation rises earlier for the first time, the pulse signal traveling through the fourth inverter in the first delay circuit 10 in the (k1) circulation rises earlier again than the pulse signal traveling through the fourth inverter in the second delay circuit 20 in the k-th circulation. Expression (3) is therefore rewritten to Expression (3A).

$$\Delta t=6Ts/(6k+5) \quad \text{Expression (3A)}$$

As described above, Expression (3) depicts the difference between the interval Tf between the pulse signals produced in the first delay circuit 10 and the interval Ts between the pulse signals produced in the second delay circuit 20. Further, in the example depicted in FIG. 4, since the pulse signal produced from the input signal INA and passing through five inverters rises earlier than the pulse signal produced from the input signal INB, the time difference between the time when the logical value of the input signal INA rises and the time when the logical value of the input signal INB rises is derived from Expressions (3A) and (4) as follows: 5×Δt=30Ts/(6k+5).

A method for measuring the time interval Ts, which is measured based on the reference clock, will be described with reference to FIG. 5.

Figure 5:
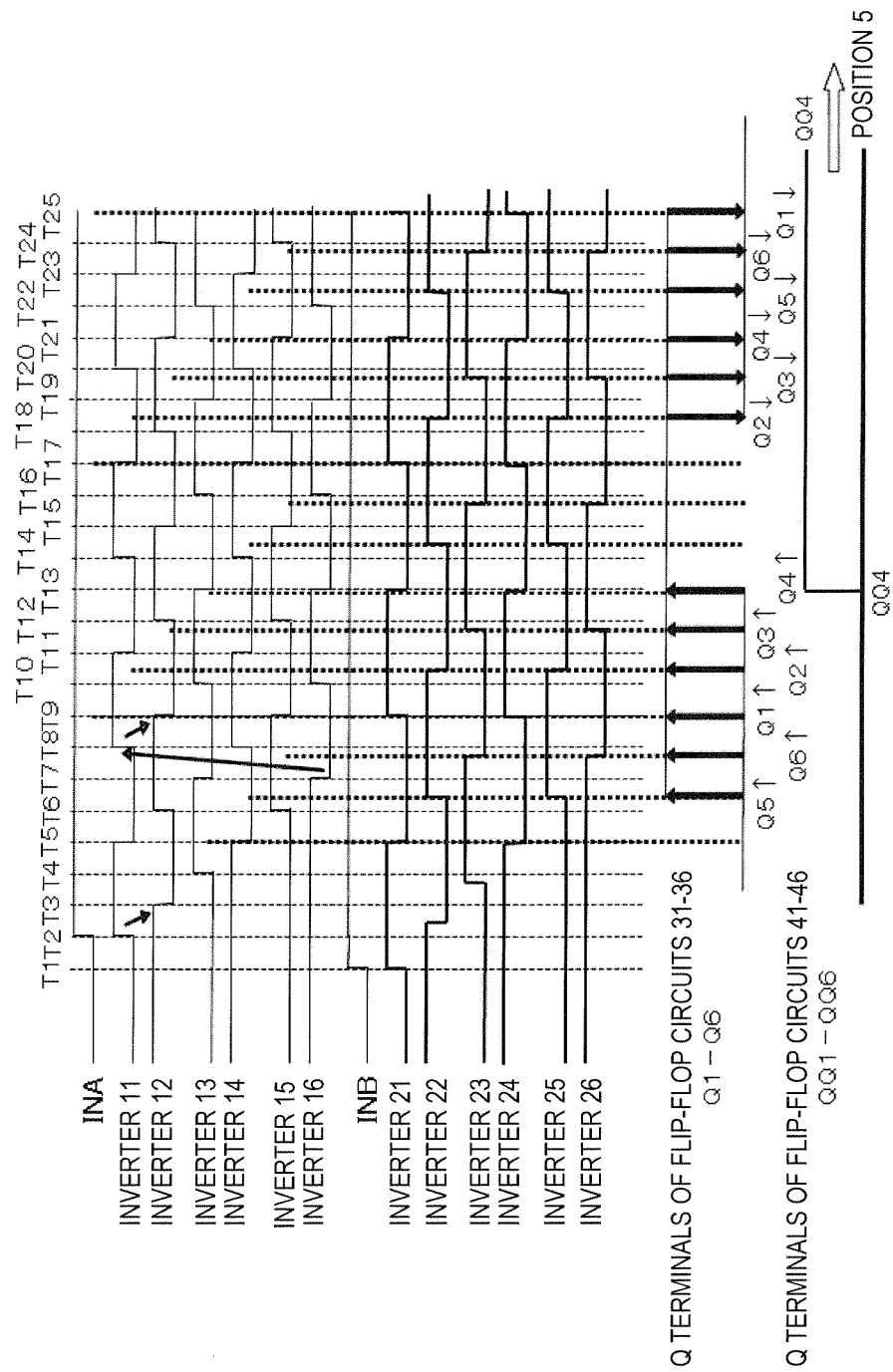
FIG. 5 describes the operation of a first flip-flop column 30 and a second flip-flop column 40.

FIG. 5 describes the operation of the first flip-flop column 30 and the second flip-flop column 40.

In FIG. 5, the input signals INA and INB are input with a positive time difference therebetween, that is, the input signal INB is input before the input signal INA is input.

A description will be made of how the input signal INA is input to the first delay circuit 10 and propagates through the inverters 11, 12, 13, 14, 15, and 16.

The logical value of the signal output from the inverter 11 rises at time T2, T8, T14, and T20. The logical value of the signal output from the inverter 11 falls at time T5, T11, T17, and T23.

The logical value of the signal output from the inverter 12 rises at time T6, T12, T18, and T24. The logical value of the signal output from the inverter 12 falls at time T3, T9, T15, and T21.

The logical value of the signal output from the inverter 13 rises at time T4, T10, T16, and T22. The logical value of the signal output from the inverter 13 falls at time T7, T13, and T19.

The logical value of the signal output from the inverter 14 rises at time T8, T14, and T20. The logical value of the signal output from the inverter 14 falls at time T5, T11, T17, and T23.

The logical value of the signal output from the inverter 15 rises at time T6, T12, T18, and T24. The logical value of the signal output from the inverter 15 falls at time T9, T15, and T21.

The logical value of the signal output from the inverter 16 rises at time T10, T16, and T22. The logical value of the signal output from the inverter 16 falls at time T7, T13, and T19.

The inverter 11 produces a rising-logic pulse signal, and each of the inverters 12 to 16 alternately produces a falling-logic pulse signal and a rising-logic pulse signal.

A description will further be made of how the input signal INB is input to the second delay circuit 20 and propagates through the inverters 21, 22, 23, 24, 25, and 26.

The logical value of the signal output from the inverter 21 rises at time T1, T9, and T17. The logical value of the signal output from the inverter 21 falls at time T5, T13, and T21.

The logical value of the signal output from the inverter 22 rises at a point between time T6 and T7, a point between T14 and T15, and a point between T22 and T23. The logical value of the signal output from the inverter 22 falls at a point between time T2 and T3, a point between T10 and T11, and a point between T18 and T19.

The logical value of the signal output from the inverter 23 rises at a point between time T3 and T4, a point between T11 and T12, and a point between T19 and T20. The logical value of the signal output from the inverter 23 falls at a point between time T7 and T8, a point between T15 and T16, and a point between T23 and T24.

The logical value of the signal output from the inverter 24 rises at time T9, T17, and T25. The logical value of the signal output from the inverter 24 falls at time T5, T13, and T21.

The logical value of the signal output from the inverter 25 rises at a point between time T6 and T7, a point between T14 and T15, and a point between T22 and T23. The logical value of the signal output from the inverter 25 falls at a point between T10 and T11 and a point between T18 and T19.

The logical value of the signal output from the inverter 26 rises at a point between time T11 and T12 and a point between T19 and T20. The logical value of the signal output from the inverter 26 falls at a point between time T7 and T8, a point between T15 and T16, and a point between T23 and T24.

The inverter 21 produces a rising-logic pulse signal, and each of the inverters 22 to 26 alternately produces a falling-logic pulse signal and a rising-logic pulse signal.

The description made with reference to FIG. 1 depicts that the first flip-flop column 30 is formed of a train of flip-flop circuits that latch the pulse signals produced in the train of inverters in the first delay circuit 10 by using the pulse signals produced from the train of inverters in the second delay circuit 20.

When the logical values of the pulse signals in the second delay circuit 20 change earlier than the logical values of the pulse signals in the first delay circuit 10 do, the flip-flop circuits that belong to the first flip-flop column 30 output signals having the logical value "L". The change in logical value used herein includes both the rising and falling of the logical value.

Conversely, when the logical values of the pulse signals in the second delay circuit 20 change later than the logical values of the pulse signals in the first delay circuit 10, the flip-flop circuits that belong to the first flip-flop column 30 output signals having the logical value "H".

Therefore, when the logical values of the pulse signals in the second delay circuit 20 change earlier, all the flip-flop circuits in the first flip-flop column temporarily output signals having the logical value "L", whereas when the logical values of the pulse signals in the second delay circuit 20 change later, flip-flop circuits that receive signals from the inverters that operate as described above in the first delay circuit 10 and the second delay circuit 20 output signals having the logical value "H".

Thereafter, when the logical values of the pulse signals in the second delay circuit 20 change earlier again than the logical values of the pulse signals in the first delay circuit 10, the flip-flop circuits that belong to the first flip-flop column 30 output signals having the logical value "L".

In the present embodiment, the flip-flop circuits 31 to 36 then output signals Q1 to Q6 through the Q terminals. As will be understood from the description described above, in the present embodiment, the logical value of the signal Q5 rises at a point between time T6 and T7. The logical value of the signal Q6 rises at a point between time T7 and T8. The logical value of the signal Q1 rises at time T9. The logical value of the signal Q2 rises at a point between time T10 and T11. The logical value of the signal Q3 rises at a point between time T11 and T12. The logical value of the signal Q4 rises at time T13. The logical value of the signal Q2 falls at a point between time T18 and T19. The logical value of the signal Q3 falls at a point between time T19 and T20. The logical value of the signal Q4 falls at time T21. The logical value of the signal Q5 falls at a point between time T22 and T23. The logical value of the signal Q6 falls at a point between time T23 and T24. The logical value of the signal Q1 falls at time T25.

The second flip-flop column 40 is formed of the flip-flop circuits 41, 42, 43, 44, 45, and 46, which latch an output signal output from one of the train of flip-flop circuits in the first flip-flop column 30 by using an output signal output from the flip-flop circuit immediately before the one flip-flop circuit. The output signal output from the flip-flop circuit in the first flip-flop column where the logical value of the output signal changes from "L" to "H" for the first time is therefore latched by the corresponding flip-flop circuit in the second flip-flop column 40 after the pulse signals in the second delay circuit 20 rise later and when the logical value of the output signal output from the flip-flop circuit immediately before the flip-flop circuit in the first delay circuit 10 changes from "L" to "H", and the logical value of the output signal output from the flip-flop circuit in the second flip-flop column 40 changes.

In the present embodiment, the flip-flop circuits 41 to 46 output the signals QQ1 to QQ6 through the Q terminals, and the logical value of only the signal QQ4 rises at the time T13.

That is, the second flip-flop column 40 detects the flip-flop circuit in the first flip-flop column that recognizes that the pulse signal traveling through the first delay circuit 10 rises earlier than the pulse signal traveling through the second delay circuit 20. The second flip-flop column 40 therefore detects positional information on which inverter produces a pulse signal when the pulse signal in the first delay circuit 10 rises earlier.

The second flip-flop column 40 therefore detects, to derive Expression (3) described above, the following positional information used in Expression (1) described above: positional information on which inverter causes the logical value of the pulse signal to change earlier in the first pulse signal circulation and positional information on which inverter causes the logical value of the pulse signal to rise earlier in the k-th pulse signal circulation.

Figure 6:
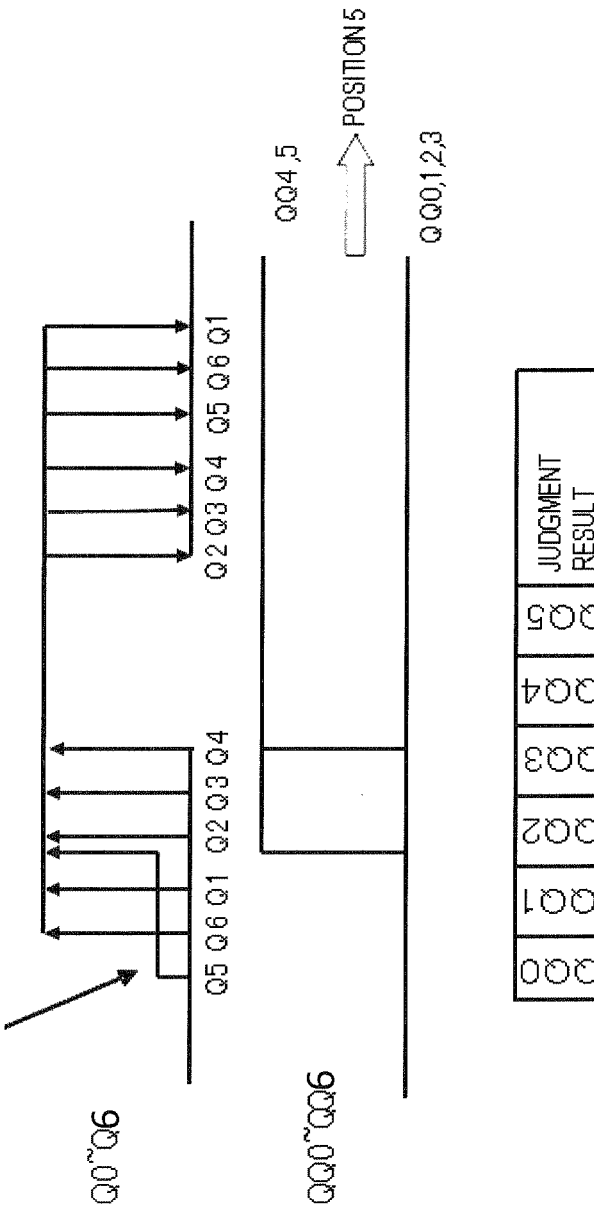
FIGS. 6A and 6B describe a process carried out when a meta-stable state occurs in any of flip-flop circuits 31 to 36, which form the first flip-flop column 30.

FIGS. 6A and 6B describe a process carried out when a meta-stable state occurs in any of the flip-flop circuits 31 to 36, which form the first flip-flop column 30. FIG. 6A depicts that in the flip-flop circuit 35 in the first flip-flop column 30 occurs a meta-stable state, in which the logical value of the output signal Q5 from the flip-flop circuit 35 becomes unstable and rises after the logical value of the output signal Q1 from the flip-flop circuit 31 rises. The meta-stable state used herein is a state in which an output signal from a flip-flop circuit becomes unstable when a period for setting up or holding an input signal to the flip-flop circuit does not satisfy a predetermined value.

On the other hand, the logical values of the output signals Q6, Q1, Q2, Q3, and Q4 from the flip-flop circuits 36, 31, 32, 33, and 34 normally rise in this order.

As a result, the logical value of the output signal QQ5 from the flip-flop circuit 45 in the second flip-flop column 40 rises, and then the logical value of the output signal QQ4 from the flip-flop circuit 44 rises. The reason why the logical value of the output signal QQ5 from the flip-flop circuit 45 rises as described above is that if the logical value of the flip-flop circuit 35 in the first flip-flop column rises from "L" to "H" before the logical value of the output signal from the flip-flop circuit 36 rises from "L" to "H", the logical value rising order is reversed.

Thereafter, the logical values of pulse signals do not rise earlier in the inverters 11 to 16 in the first delay circuit, and the logical values of the output signals Q1 to Q6 fall sequentially.

FIG. 6B is a table illustrating the relationship between the logical values of the output signals QQ1 to QQ6 from the flip-flop circuits 41 to 46 and the position of the inverter among the inverters in the second delay circuit 20 where the pulse signals in the second delay circuit 20 start rising later. In the table depicted in FIG. 6B, the logical values of the output signals QQ1 to QQ6 are depicted from the leftmost field to the right, and the position of the inverter determined by the logical values of the output signals QQ1 to QQ6 is depicted in the rightmost field in the table. The logical values of the output signals QQ1 to QQ6 (x00001) indicates the position 0, (00001x) indicates the position 5, (0001x0) indicates the position 4, (001x00) indicates the position 3, (01x000) indicates the position 2, and (1x0000) indicates the position 1. The logic state "x" represents a state in which the logical value may be "1" or "0", that is, what is called a don't care state.

Consider a situation where an output signal has the logical value "1" and the following output signal has the don't care state, and the pulse signal output from an inverter in the second delay circuit 20 rises later than the pulse signal in the first delay circuit 10 does. Even when in the flip-flop circuit in the first flip-flop column 30 that receive the output signal from the inverter in the second delay circuit 20 and the output signal from the inverter in the first delay circuit 10, the time interval between the output signals shortens and a meta-stable state occurs, the position of the inverter among the inverters in the second delay circuit 20 where the pulse signal output therefrom rises later may be determined.

That is, in the state depicted in FIG. 6A, even when the logical values of the output signals QQ4 and QQ5 rise, the logical value of the output signal QQ5 that has risen is ignored, and the inverter in question in the second delay circuit 20 is found to be the fifth one based only on the logical value of the output signal QQ4 that has risen.

Figure 7:
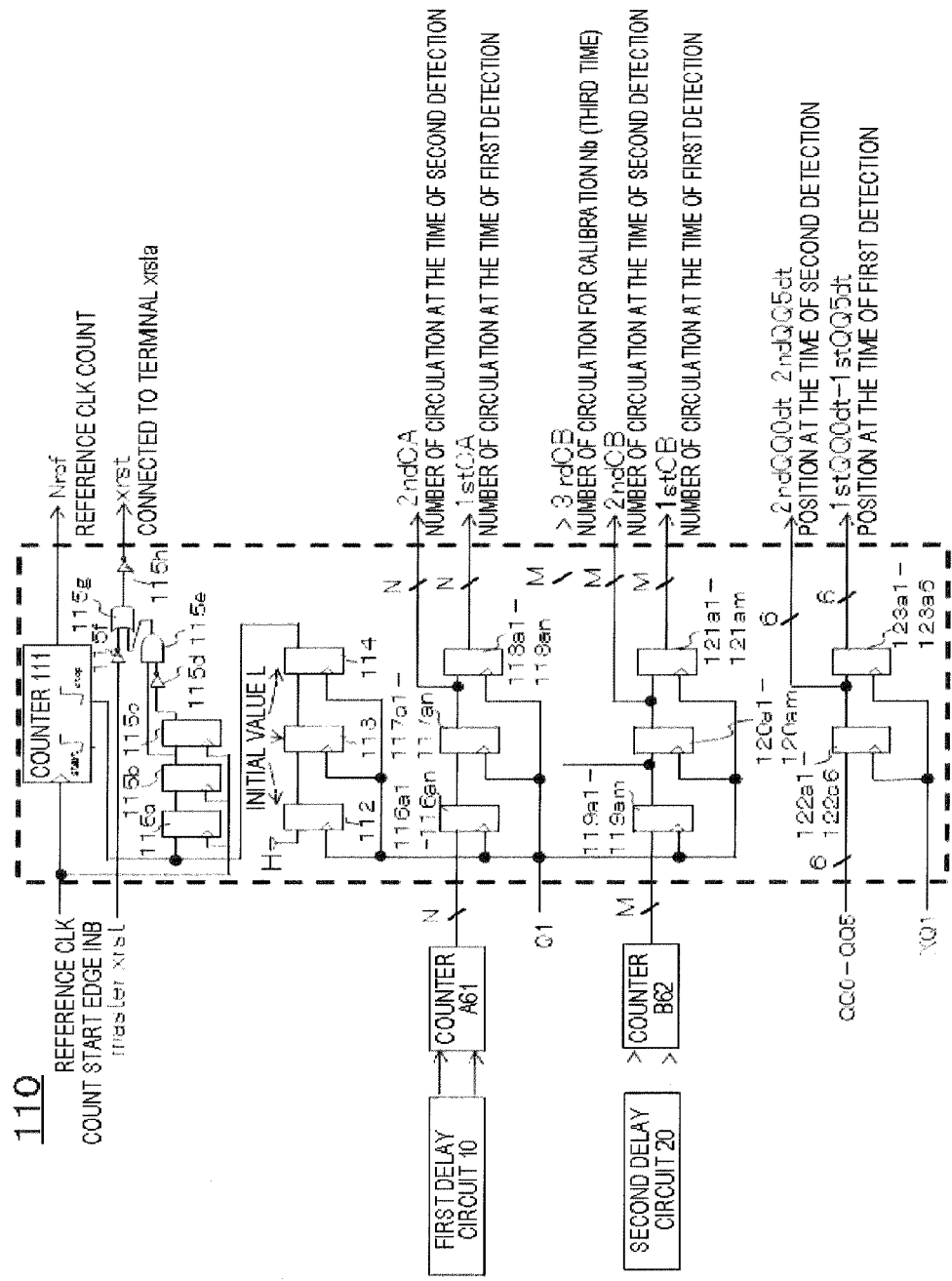
FIG. 7 depicts a detection result output circuit 110.

FIG. 7 depicts the detection result output circuit 110. The detection result output circuit 110 includes a counter 111, flip-flop circuits 112, 113, and 114, flip-flop circuits 115a to 115c, inverters 115d, 115f, and 115h, an AND circuit 115e, an OR circuit 115g, flip-flop circuits 116a1 to 116an (n is a positive integer), flip-flop circuits 117a1 to 117an (n is a positive integer), flip-flop circuits 118a1 to 118an (n is a positive integer), flip-flop circuits 119a1 to 119am (m is a positive integer), flip-flop circuits 120a1 to 120am (m is a positive integer), flip-flop circuits 121a1 to 121am (m is a positive integer), flip-flop circuits 122a1 to 122a6, and flip-flop circuits 123a1 to 123a6.

The counter 111 receives the signal INB, the reference CLK (reference clock), and a signal through the Q terminal of the flip-flop circuit 114. When the logical value of the signal INB rises from "L" to "H", the counter 111 starts counting the reference CLK, and then when the logical value of the signal through the Q terminal of the flip-flop circuit 114 rises from "L" to "H", the counter 111 stops counting the reference CLK. When the counter 111 stops counting the reference clock, the counter 111 outputs s (s is a positive integer) signals having logical values corresponding to the bits that express the binary count Nref of the reference CLK incremented during the period from the time when the counter starts counting the reference CLK to the time when the counter stops counting.

When the flip-flop circuits 112, 113, and 114 receive through the CLK terminals thereof the signal Q1 output through the Q terminal of the flip-flop circuit 31, the flip-flop circuits 112, 113, and 114 latch signals input to the D terminals thereof and output the signals through the Q terminals thereof. The initial logical value of the signal output through the Q terminal of each of the flip-flop circuits 112, 113, and 114 is "L". Further, a signal having the logical value "H" is always input to the D terminal of the flip-flop circuit 112. The Q terminal of the flip-flop circuit 112 is connected to the D terminal of the flip-flop circuit 113. The Q terminal of the flip-flop circuit 113 is connected to the D terminal of the flip-flop circuit 114. The Q terminal of the flip-flop circuit 114 is connected to the input terminals of the inverters 115. The signal INB is an input signal to the pulse width setting circuit B80, and the inverter 21 produces a pulse signal in response to the output signal from the NAND circuit 73 when it receives the signal INB. As a result, when the rising edge of the pulse signal output from the inverter 21 in the second delay circuit 20 coincides with that of the corresponding pulse signal in the first delay circuit 10, the logical value of the signal Q1 output through the Q terminal of the flip-flop circuit 31 rises from "L" to "H". Therefore, when the rising edge of the pulse signal output from the inverter 21 in the second delay circuit 20 coincides with that of the corresponding pulse signal in the first delay circuit 10 three times, the logical value of the signal output through the Q terminal of the flip-flop circuit 114 becomes "H".

The output signal through the Q terminal of the flip-flop circuit 114 is supplied to the D terminal of the flip-flop circuit 115a. The Q terminal of the flip-flop circuit 115a is connected to the D terminal of the flip-flop circuit 115b. The Q terminal of the flip-flop circuit 115b is connected to the D terminal of the flip-flop circuit 115c. The reference clock CLK is input to the CLK terminals of the flip-flop circuits 115a, 115b, and 115c. As a result, the flip-flop circuits 115a, 115b, and 115c sequentially latch the logical value "H" output through the Q terminal of the flip-flop circuit 114 based on the reference clock CLK and sequentially output signals having the logical value "H" through the Q terminals thereof. The Q terminal of the flip-flop circuit 115c is connected to one of the input terminals of the AND circuit 115e via the inverter 115d, and the Q terminal of the flip-flop circuit 115b is connected to the other input terminal of the AND circuit 115e. In this configuration, the AND circuit 115e outputs a pulse signal having the logical value "H" and corresponding to one cycle of the reference clock CLK. The output signal from the AND circuit 115e is supplied to one of the input terminals of the OR circuit 115g and becomes the signal Xrst via the inverter 115h. In this configuration, when the AND circuit 115e outputs a pulse signal having the logical value "H", the logical value of the signal Xrst becomes "L" during the period when the AND circuit 115e keeps outputting the pulse signal. As a result, the logical values of the signals output from the inverters 12, 14, 16, 22, 24, and 26 are fixed.

On the other hand, a signal masterxrst, the logical value of which is "H" when the TDC 50 is in operation, whereas being "L" when the TDC 50 is idling, is input to the other input terminal of the OR circuit 115g via the inverter 115f. As a result, since the OR circuit 115g outputs a signal having the logical value "L" unless it receives the pulse signal from the AND circuit 115e, the signal Xrst has the logical value "H" when the TDC 50 is in operation. As a result, each of the inverters 12, 14, 16, 22, 24, and 26 functions as a typical inverter. The signal masterxrst has the logical value "L" when the TDC 50 is idling, and the logical values of the signals output from the inverters 12, 14, 16, 22, 24, and 26 are fixed.

When the logical value of the signal Xrst is "L", the flip-flop circuits 31 to 36, the flip-flop circuits 41 to 46, the counter A61, and the counter B62 are reset, as depicted in FIG. 1.

When the flip-flop circuits 116a1 to 116an (n is a positive integer), the flip-flop circuits 117a1 to 117an (n is a positive integer), and the flip-flop circuits 118a1 to 118an (n is a positive integer) receive through the CLK terminals thereof the signal Q1 output through the Q terminal of the flip-flop circuit 31, the flip-flop circuits 116a1 to 116an, 117a1 to 117an, and 118a1 to 118an latch the signals input to the D terminals thereof and output the signals through the Q terminals thereof.

The flip-flop circuits 116a1 to 116an (n is a positive integer) receive through the D terminals thereof the signals output from the counter A61 and having the logical values of the digits of the binary count from the counter A61. The Q terminals of the flip-flop circuits 116a1 to 116an (n is a positive integer) are connected to the D terminals of the flip-flop circuits 117a1 to 117an (n is a positive integer).

The Q terminals of the flip-flop circuits 117a1 to 117an (n is a positive integer) are connected to the D terminals of the flip-flop circuits 118a1 to 118an (n is a positive integer). The flip-flop circuits 117a1 to 117an (n is a positive integer)

output respective N signals 2ndCA through the Q terminals. The signals 2ndCA represent the number of pulse signal circulation at the time when the logical value of a pulse signal in the first delay circuit 10 changes earlier than that of the corresponding pulse signal in the second delay circuit 20 for the second time.

The flip-flop circuits 118a1 to 118an (n is a positive integer) output respective N signals 1stCA through the Q terminals. The signals 1stCA represent the number of pulse signal circulation at the time when the logical value of a pulse signal in the first delay circuit 10 changes earlier than that of the corresponding pulse signal in the second delay circuit 20 for the first time.

When the flip-flop circuits 119a1 to 119am (m is a positive integer), the flip-flop circuits 120a1 to 120am (m is a positive integer), and the flip-flop circuits 121a1 to 121am (m is a positive integer) receive through the CLK terminals thereof the signal Q1 output through the Q terminal of the flip-flop circuit 31, the flip-flop circuit 119a1 to 119am, 120a1 to 120am, and 121a1 to 121am latch the signals input to the D terminals thereof and output the signals through the Q terminals thereof.

The flip-flop circuits 119a1 to 119am (m is a positive integer) receive through the D terminals thereof the signals output from the counter B62 and having the logical values of the digits of the binary count from the counter B62. The Q terminals of the flip-flop circuits 119a1 to 119am (m is a positive integer) are connected to the D terminals of the flip-flop circuits 120a1 to 120am (m is a positive integer). The flip-flop circuits 119a1 to 119am (m is a positive integer) output respective M signals 3irdCB through the Q terminals. The Q terminals of the flip-flop circuits 120a1 to 120am (m is a positive integer) are connected to the D terminals of the flip-flop circuits 121a1 to 121am (m is a positive integer). The flip-flop circuits 120a1 to 120am (m is a positive integer) output respective M signals 2ndCB through the Q terminals. The flip-flop circuits 121a1 to 121am (m is a positive integer) output respective M signals 1stCA through the Q terminals.

The binary number expressed by the M signals 3irdCB represents the count Nb from the counter B62 at the time when the logical value of a pulse signal in the first delay circuit 10 changes earlier than that of the corresponding pulse signal in the second delay circuit 20 for the third time. Further, the time when the counter 111 receives a reference CLK counting end edge and stops counting the reference CLK coincides with the time when the logical value of a pulse signal in the first delay circuit 10 changes earlier than that of the corresponding pulse signal in the second delay circuit 20 for the third time. In this case, the following expression is derived:

$$Ts = Tref \times Nref/(6Nb+1) \quad \text{Expression (5)}$$

where Tref represents the cycle of the reference CLK, Nref represents the count of the reference CLK, and Ts represents the interval between pulse signals in the second delay circuit 20.

When the clock cycle Tref of the reference CLK is known, Expression (5) may be used to calculate the interval Ts between pulse signals in the second delay circuit 20.

When the flip-flop circuits 122a1 to 122a6 and the flip-flop circuits 123a1 to 123a6 receive through the CLK terminals thereof the signal XQ1 output through the XQ terminal of the flip-flop circuit 31, the flip-flop circuits 122a1 to 122a6 and 123a1 to 123a6 latch signals input to the D terminals thereof and output the signals through the Q terminals thereof.

The flip-flop circuits 122a1 to 122a6 receive through the D terminals thereof the output signals QQ1 to QQ6 output through the Q terminals of the flip-flop circuits 41 to 46.

The Q terminals of the flip-flop circuits 122a1 to 122a6 are connected to the D terminals of the flip-flop circuits 123a1 to 123a6.

The flip-flop circuits 122a1 to 122a6 output signals 2ndQQ1dt to 2ndQQ6dt through the Q terminals. The signals 2ndQQ1dt to 2ndQQ6dt represent the digits of the binary number representing the position of the inverter among the inverters in the first delay circuit 10 where the logical value of the pulse signal in the first delay circuit 10 changes earlier than that of the pulse signal in the second delay circuit 20 for the second time.

The flip-flop circuits 123a1 to 123a6 output signals 1stQQ1dt to 1stQQ6dt through the Q terminals. The signals 1stQQ1dt to 1stQQ6dt represent the digits of the binary number representing the position of the inverter among the inverters in the first delay circuit 10 where the logical value of the pulse signal in the first delay circuit 10 changes earlier than that of the pulse signal in the second delay circuit 20 for the first time.

The binary number expressed by the signals 1stQQ1dt to 1stQQ6dt therefore represents A in Expression (3). Similarly, the binary number expressed by the signals 2ndQQ1dt to 2ndQQ6dt represents B in Expression (3).

Further, the variable k described in Expression (3) may be derived by subtracting the binary number expressed by the N signals 1stCA from the binary number expressed by the N signals 2ndCA. Similarly, the variable (k+1) described in Expression (3) may be derived by subtracting the binary number expressed by the M signals 1stCB from the binary number expressed by the M signals 2ndCB. At may then be calculated by actually substituting the values A, B, k, and k+1 into Expression (3) and assuming that the interval between pulse signals in the second delay circuit 20 is Ts in Expression (3). Further, the time difference between the time when the input signal INA is input and the time when the input signal INB is input may be determined by Expression (4).

Since Ts has been determined in Expression (5) based on the relationship between Ts and the cycle Tref of the reference clock, the time difference TT between the time when the input signal INA is input and the time when the input signal INB is input may be finally determined by the following expression:

$$TT = 6A \times Tref \times (6Nb+1)/Nref/(6k+6-A+B) \quad \text{Expression (6)}$$

As described above, the TDC circuit 50 according to the first embodiment includes a first delay circuit (first delay circuit 10) having an even number of first inverting delay devices (such as inverter 11) connected in series to form a loop, each of the first inverting delay devices outputting a signal having a logical value inverted from the logical value of an input signal after a first signal delay period, a second delay circuit (second delay circuit 20) having the same even number of second inverting delay devices (such as inverter 21) connected in series to form a loop as that of the first inverting delay devices, each of the second inverting delay devices outputting a signal having a logical value inverted from the logical value of an input signal after a second signal delay period different from the first signal delay period, a first pulse signal drive circuit (pulse width setting circuit A70) that receives a first input signal (signal INA) and causes any of the first inverting delay devices to produce a first pulse signal, a second pulse signal drive circuit (pulse width setting circuit B80) that receives a second input signal (signal INB) and causes any of the second inverting delay devices to produce a second pulse signal, a plurality of first flip-flop circuits (first flip-flop column 30) that latch the logical values of third pulse signals including the first pulse signal output from the first inverting delay devices corresponding to the second inverting delay devices or pulse signals produced by the first inverting delay devices in response to the first pulse signal based on fourth pulse signals including the second pulse signal or pulse signals produced by the second inverting delay devices in response to the second pulse signal, a first counter (counter A61) that counts a pulse signal produced by any one of the first inverting delay devices, a second counter (counter B62) that counts a pulse signal produced by any one of the second inverting delay devices, and a storage circuit (detection result output circuit 110) that, when the plurality of first flip-flop circuits latch the third pulse signals based on the fourth pulse signals and the logical value of the signal latched by any of the plurality of first flip-flop circuits changes from "L" to "H", stores the count from the first counter and the count from the second counter.

In the configuration described above, a pulse signal produced by the first pulse signal drive circuit propagates through the first delay circuit that forms a loop. Similarly, a pulse signal produced by the second pulse signal drive circuit also propagates through the second delay circuit that forms a loop.

When the first input signal is first input and the second input signal is then input with a time difference therebetween, the first pulse signal drive circuit and the second pulse signal drive circuit start operating at different timings, whereby a time difference is produced between the time when the third pulse signals are produced in the first delay circuit and the time when the fourth pulse signal are produced in the second delay circuit.

At this point, when the first signal delay period in each of the first inverting delay devices is shorter than the second signal delay period in each of the second inverting delay devices, the interval between the fourth pulse signals in the second delay circuit is longer.

In this case, even when there is a time difference between the timings when the pulses are produced, the logical value of any of the third pulse signals propagating through the first delay circuit changes earlier than that of the corresponding fourth pulse signal propagating through the second delay circuit, and even the earlier logical value change occurs for the second time after the pulse signals further propagate through the loop-shaped inverting delay devices.

As a result, the ratio of the difference between the first signal delay period and the second signal delay period to the second signal delay period change may be determined based on the number of first inverting delay devices and the number of second inverting delay devices involved in the pulse propagation during the period from the first earlier logical value change to the second earlier logical value change.

On the other hand, since the second signal delay period may be determined by comparing it with the reference clock, the difference between the first signal delay period and the second signal delay period may be determined.

As a result, the time difference between the time when the first input signal is input and the time when the second input signal is input may be determined based on the number of second inverting devices in the second delay circuit that are involved in the pulse propagation until the first earlier logical value change occurs and the difference between the first signal delay period and the second signal delay period.

The TDC circuit 50 may further comprise a plurality of second flip-flop circuits (flip-flop circuits 41 to 46, that is, second flip-flop column 40) that receive an output from one of the plurality of first flip-flop circuits through CLK terminals and receive an output from one of the other first flip-flop circuits through D terminals.

The logical values of the output signals from the first flip-flop circuits change when the logical values of the pulse signals in the first delay circuit change earlier than those of the pulse signals in the second delay circuit. In this case, the second flip-flop circuits latch the signal from the first flip-flop circuit where the first logical value change has occurred by using the signal from the first flip-flop circuit where the following logical value change has occurred. As a result, the second flip-flop circuits may detect the first flip-flop circuit where the logical value of the signal output therefrom has changed for the first time.

In the TDC circuit 50, each of the first inverting delay devices (such as inverter 11), the second inverting delay devices (such as inverter 21), the plurality of first flip-flop circuits (first flip-flop column 30), and the plurality of second flip-flop circuits (second flip-flop column 40) may be driven by complementary signals.

When each of the circuits described above may handle complementary signals, change in logical value may be more readily detected than in a case where they handle a single-phase signal.

In the TDC circuit 50, the first inverting delay device that produces the first pulse signal may have a reset terminal and output a signal having a fixed logical value when a signal having a logical value "L" is input to the reset terminal irrespective of the logical values of signals input to the first inverting delay device. The first pulse signal drive circuit (pulse width setting circuit A70) may input a signal having the logical value "L" to the reset terminal of the first inverting delay device that produces the first pulse signal when the first input signal (signal INA) is input to the first pulse signal drive circuit. The third pulse signal produced by the first inverting delay device that produces the first pulse signal propagates through one-half the first inverting delay devices, which are connected to form the loop, and the first pulse signal drive circuit (pulse width setting circuit A70) inputs a signal having a logical value "H" to the reset terminal of the first inverting delay device that produces the first pulse signal in response to the pulse signal having propagated through the one-half the first inverting delay devices.

The cycle of the third pulse signal in the first delay circuit is determined by the period requested for the pulse signal to propagate through all the first inverting delay devices. In view of this fact, the first pulse signal drive circuit releases the reset state of the first inverting delay device that produces the first pulse signal by using the third pulse signal having propagated through one-half the first inverting delay devices. As a result, the period during which the first inverting delay device is kept reset is substantially equal to the period during which it is released from the reset state. In this case, pulses are formed when the first inverting delay device is kept reset, whereby the pulse width becomes substantially one-half a single cycle.

The TDC circuit further includes a detection result output circuit (detection result output circuit 110), and the detection result output circuit includes a first register (flip-flop circuits 118*a*1 to 118*an*, flip-flop circuits 121*a*1 to 121*an*, and flip-flop circuits 123*a*1 to 123*a*6) that stores, when the first pulse signal produced by the first inverting delay device rises earlier than the second pulse signal produced by the second inverting delay device for the first time, the count from the first counter, the count from the second counter, and the position of the second inverting delay device in the second delay circuit where the second pulse signal is produced, a second register (flip-flop circuits 117a1 to 117an, flip-flop circuits 120a1 to 120an, and flip-flop circuits 122a1 to 122a6) that stores, when the first pulse signal produced by the first inverting delay device rises earlier than the second pulse signal produced by the second inverting delay device for the second time, the count from the first counter, the count from the second counter, and the position of the second inverting delay device in the second delay circuit where the second pulse signal is produced, a third resister (flip-flop circuits 119a1 to 119an) that stores the count from the second counter when the first pulse signal produced by the first inverting delay device rises earlier than the second pulse signal produced by the second inverting delay device for the third time, and a counter (counter 111) that counts the reference clock input to the detection result output circuit during a period from the time when the second input signal (signal INB) is input to the time when the first pulse signal produced by the first inverting delay device rises earlier than the second pulse signal produced by the second inverting delay device for the third time and stores the count.

The positive time difference between the time when the input signal INA is input and the time when the input signal INB is input may be calculated based on the following information stored in the detection result output circuit: "the count from the first counter and the count from the second counter at the time of first earlier rise, and the position of the second inverting delay device in the second delay circuit where the second pulse signal is produced at the time of first earlier rise," "the count from the first counter and the count from the second counter at the time of second earlier rise, and the position of the second inverting delay device in the second delay circuit where the second pulse signal is produced at the time of second earlier rise," and "the count of the reference clock input to the detection result output circuit at the time of third earlier rise."

Advantageous effects provided by the TDC circuit according to the first embodiment described above are summarized as follows: First, each of the first and second delay circuits through which pulse signals propagate is formed of an even small number of logic devices which are connected to form a loop and each of which outputs an inverted signal, whereby the first and second delay circuits, through which the third and fourth pulse signals propagate, may be small in scale.

Since each of the first and second delay circuits is formed of an even number of logic devices each of which outputs an inverted signal, each of the logic devices outputs a signal having fixed logic, rising or falling logic.

Further, the pulse width of each of the pulse signals propagating through the first and second delay circuits is nearly one-half the cycle of each of the pulse signals.

Each of the propagating third and fourth pulse signals, which contains pulses whose logical value rises and then falls and pulses whose logical value falls and then rises, reflects at an edge where the logical value changes the difference in input timing between input signals the time difference between which is desired to be detected.

Further, after the pulse width setting circuits A70 and B80 cause the inverters 11 and 21 to produce the first and second pulse signals, and the third and fourth pulse signals propagate from the inverters 11 and 21 to the inverters 16 and 26, the pulse width setting circuits A70 and B80 further cause the inverters 11 and 21 to produce another set of first and second pulse signals.

When each of the delay circuits is formed of an odd number of logic circuits connected to form a loop, the difference in timing at which input signals are input is detected based on the difference in the cycle of the oscillatory clock between the delay circuits. In contrast, in the TDC circuit according to the first embodiment, the difference in timing at which input signals are input is detected based on the signal delay time difference between the logic circuits in the first and the logic circuits second delay circuits, as indicated by Expression (3). Since the difference in signal delay period described above may be set to a small value, the TDC circuit according to the embodiment may precisely detect the difference in timing at which input signals are input.

The flip-flop circuits 31 to 36 may not respond unless there is a certain amount of time difference between the edge where the logical value of the third pulse signal changes and the edge where the logical value of the fourth pulse signal changes. However, since the difference in signal delay period is calculated by detecting that the logical value of the third pulse signal in the first delay circuit changes earlier than the logical value of the fourth pulse signal in the second delay circuit changes for the second and third times, the periods requested for the flip-flop circuits to respond are cancelled. Further, even when the flip-flop circuits 31 to 36 do not have an enough difference between the edge where the logical value of the third pulse signal changes and the edge where the logical value of the fourth pulse signal changes, and the flip-flop circuits operate in the meta-stable state depicted in FIG. 6A, making the judgment as depicted in FIG. 6B allows accurate the TDC circuit to detect that the logical value of the third pulse signal in the first delay circuit changes earlier than the logical value of the fourth pulse signal in the second delay circuit changes for the first time.

As described above, the TDC circuit 50 according to the first embodiment may precisely detect the time difference between the time when one input signal is input and the time when the other input signal is input by using a delay circuit through which a pulse signal resulting from the one input signal propagates and a delay circuit through which a pulse signal resulting from the other input signal propagates.

Second Embodiment

A TDC circuit 130 according to a second embodiment includes an edge detection circuit 51 and a detection result output circuit 140. The edge detection circuit 51 has been described in the first embodiment and is therefore not described. The TDC circuit 130 according to the second embodiment may measure the time difference even when the time difference between the time when the input signal INA is input and the time when the input signal INB is input is negative. "The negative time difference" means that the input signal INB is input after the input signal INA is input. The principle based on which a negative time difference is measured and the TDC circuit 130 according to the second embodiment will be described below with reference to FIGS. 8A and 8B.

FIGS. 8A and 8B are a circuit diagram and an operation descriptive diagram of the TDC circuit 130 according to the second embodiment, respectively. In the circuit depicted in FIG. 8A, the detection result output circuit 140 includes a counter 131, flip-flop circuits 132, 133, 134, and 135, flip-flop circuits 136a, 136b, and 136c, inverters 136d, 136f, and 136h, an AND circuit 136e, an OR circuit 136g, flip-flop circuits 137a1 to 137an (n is a positive integer), flip-flop circuits 138a1 to 138an (n is a positive integer), flip-flop circuits 139a1 to 139an (n is a positive integer), flip-flop circuits 140a1 to 140an (n is a positive integer), flip-flop circuits 141a1 to 141am (m is a positive integer), flip-flop circuits 142a1 to 142am (m is a positive integer), flip-flop circuits 143a1 to 143am (m is a positive integer), flip-flop circuits 144a1 to 144am (m is a positive integer), flip-flop circuits 145a1 to 145a6, flip-flop circuits 146a1 to 146a6, and flip-flop circuits 147a1 to 147a6.

The counter 131 receives the signal INB, the reference CLK (reference clock), and a signal through the Q terminal of the flip-flop circuit 135. When the logical value of the signal INB rises from "L" to "H", the counter 131 starts counting the reference CLK, and when the signal from the Q terminal of the flip-flop circuit 135 rises from "L" to "H", the counter 131 stops counting the reference CLK. When the counter 131 stops counting the reference clock, the counter 131 outputs s (s is a positive integer) signals having logical values corresponding to the bits that express the binary count Nref of the reference CLK incremented during the period from the time when the counter starts counting the reference CLK to the time when the counter stops counting.

When the flip-flop circuits 132, 133, 134, and 135 receive through the CLK terminals thereof the signal Q1 output through the Q terminal of the flip-flop circuit 31, the flip-flop circuits 132, 133, 134, and 135 latch signals input to the D terminals thereof and output the signals through the Q terminals thereof. The initial logical value of the signal output through the Q terminal of each of the flip-flop circuits 132, 133, 134, and 135 is "L". Further, a signal having the logical value "H" is always input to the D terminal of the flip-flop circuit 132. The Q terminal of the flip-flop circuit 132 is connected to the D terminal of the flip-flop circuit 133. The Q terminal of the flip-flop circuit 133 is connected to the D terminal of the flip-flop circuit 134. The Q terminal of the flip-flop circuit 134 is connected to the D terminal of the flip-flop circuit 135. The Q terminal of the flip-flop circuit 135 is connected to the D terminal of the flip-flop circuit 136a.

The Q terminal of the flip-flop circuit 136a is connected to the D terminal of the flip-flop circuit 136b. The Q terminal of the flip-flop circuit 136b is connected to the D terminal of the flip-flop circuit 136c. The Q terminal of the flip-flop circuit 136c is connected to one of the input terminals of the AND circuit 136e via the inverter 136d. The Q terminal of the flip-flop circuit 136b is connected to the other input terminal of the AND circuit 136e. The output from the AND circuit 136e is connected to one of the input terminals of the OR circuit 136g. The signal masterxrst is connected to the other input terminal of the OR circuit 136g via the inverter 136f. An output signal from the OR circuit 136g is output as the signal Xrst via the inverter 136h.

The signal Q1 is a signal whose logical value rises from "L" to "H" when the rising edge of the pulse signal output from the inverter 21 in the second delay circuit 20 coincides with that of the corresponding pulse signal in the first delay circuit 10, as described in the first embodiment.

The flip-flop circuits 136a, 136b, and 136c, the inverters 136d, 136f, and 136h, the AND circuit 136e, and the OR circuit 136g operate in the same manner as the flip-flop circuits 115a, 115b, and 115c, the inverters 115d, 115f, and 115h, the AND circuit 115e, and the OR circuit 115g depicted in FIG. 7. The signal masterxrst also has the same logical values as those described with reference to FIG. 7.

When the flip-flop circuits 137a1 to 137an (n is a positive integer), the flip-flop circuits 138a1 to 138an (n is a positive integer), the flip-flop circuits 139a1 to 139an (n is a positive integer), and the flip-flop circuits 140a1 to 140an (n is a positive integer) receive through the CLK terminals thereof the signal Q1 output through the Q terminal of the flip-flop circuit 31, the flip-flop circuits latch signals input to the D terminals thereof and output the signals through the Q terminals thereof.

The flip-flop circuits 137a1 to 137an (n is a positive integer) receive through the D terminals thereof the signal output from the counter A61 and having the logical values of the digits of the binary count. The Q terminals of the flip-flop circuits 137a1 to 137an (n is a positive integer) are connected to the D terminals of the flip-flop circuits 138a1 to 138an (n is a positive integer).

The Q terminals of the flip-flop circuits 138a1 to 138an (n is a positive integer) are connected to the D terminals of the flip-flop circuits 139a1 to 139an (n is a positive integer).

The Q terminals of the flip-flop circuits 138a1 to 138an (n is a positive integer) output respective N signals 3irdCA2. The signals 3irdCA2 represent the number of circulation of any of the pulse signals in the first delay circuit 10 when the logical value of the pulse signal rises earlier than that of the corresponding pulse signal in the second delay circuit 20 for the third time.

The flip-flop circuits 139a1 to 139an (n is a positive integer) output respective N signals 2ndCA2 through the Q terminals. The signals 2ndCA2 represent the number of circulation of any of the pulse signals in the first delay circuit 10 when the logical value of the pulse signal changes earlier than that of the corresponding pulse signal in the second delay circuit 20 for the second time.

The flip-flop circuits 140a1 to 140an (n is a positive integer) output respective N signals 1stCA2 through the Q terminals. The signals 1stCA2 represent the number of circulation of any of the pulse signals in the first delay circuit 10 when the logical value of the pulse signal changes earlier than that of the pulse signal in the second delay circuit 20 for the first time.

When the flip-flop circuits 141a1 to 141am (m is a positive integer), the flip-flop circuits 142a1 to 142am (m is a positive integer), the flip-flop circuits 143a1 to 143am (m is a positive integer), and the flip-flop circuits 144a1 to 144am (m is a positive integer) receive through the CLK terminals thereof the signal Q1 output through the Q terminal of the flip-flop circuit 31, the flip-flop circuits latch signals input to the D terminals thereof and output the signals through the Q terminals thereof.

The flip-flop circuits 141a1 to 141am (m is a positive integer) receive through the D terminals thereof M signals output from the counter B62 and having the logical values of the digits of the binary count. The Q terminals of the flip-flop circuits 141a1 to 141am (m is a positive integer) are connected to the D terminals of the flip-flop circuits 142a1 to 142am (m is a positive integer).

The flip-flop circuits 141a1 to 141am (m is a positive integer) output respective M signals 4thCB through the Q terminals.

The Q terminals of the flip-flop circuits 142a1 to 142am (m is a positive integer) are connected to the D terminals of the flip-flop circuits 143a1 to 143am (m is a positive integer). The flip-flop circuits 142a1 to 142am (m is a positive integer) output respective M signals 3irdCB through the Q terminals.

The Q terminals of the flip-flop circuits 143a1 to 143am (m is a positive integer) are connected to the D terminals of the flip-flop circuits 144a1 to 144am (m is a positive integer). The flip-flop circuits 143a1 to 143am (m is a positive integer) output respective M signals 2ndCA through the Q terminals.

The flip-flop circuits 144a1 to 144am (m is a positive integer) output respective M signals 1stCA through the Q terminals.

The binary number expressed by the M signals 4thCB represents the count Nb from the counter 862 at the time when the logical value of any of the pulse signals in the first delay circuit 10 rises earlier than the corresponding pulse signal in the second delay circuit 20 for the fourth time. Further, the time when the counter 131 receives the reference CLK counting end edge and stops counting the reference CLK coincides with the time when the logical value of any of the pulse signals in the first delay circuit 10 rises earlier than that of the corresponding pulse signal in the second delay circuit 20 for the fourth time. In this case, the following expression is derived:

$$Ts = Tref \times Nref/(6Nb+1) \qquad \text{Expression (7)}$$

where Tref represents the cycle of the reference CLK, Nref represents the count of the reference CLK, and Ts represents the interval between the pulse signals in the second delay circuit 20.

When the clock cycle Tref of the reference CLK is known, Expression (7) may be used to calculate the interval Ts between the pulse signals in the second delay circuit 20.

When the flip-flop circuits 145a1 to 145a6, the flip-flop circuits 146a1 to 146a6, and the flip-flop circuits 147a1 to 147a6 receive through the CLK terminals thereof the signal XQ1 output through the XQ terminal of the flip-flop circuit 31, the flip-flop circuits latch signals input to the D terminals thereof and output the signals through the Q terminals thereof.

The flip-flop circuits 145a1 to 145a6 receive through the D terminals thereof the output signals QQ1 to QQ6 output through the Q terminals of the flip-flop circuits 41 to 46.

The flip-flop circuits 145a1 to 145a6 have Q terminals connected to the D terminals of the flip-flop circuits 146a1 to 146a6 and output signals 3irdQQ1dt2 to 3irdQQ6dt2 through the Q terminals. The signals 3irdQQ1dt2 to 3irdQQ6dt2 represent the digits of the binary number representing the position of the inverter among the inverters in the first delay circuit 10 where the logical value of any of the pulse signals in the first delay circuit 10 changes earlier than that of the corresponding pulse signal in the second delay circuit 20 for the third time.

The flip-flop circuits 146a1 to 146a6 have Q terminals connected to the D terminals of the flip-flop circuits 147a1 to 147a6 and output signals 2ndQQ1dt2 to 2ndQQ6dt2 through the Q terminals. The signals 2ndQQ1dt2 to 2ndQQ6dt2 represent the digits of the binary number representing the position of the inverter among the inverters in the first delay circuit 10 where the logical value of any of the pulse signals in the first delay circuit 10 changes earlier than that of the corresponding pulse signal in the second delay circuit 20 for the second time.

The flip-flop circuits 147a1 to 147a6 output through the Q terminals thereof signals 1stQQ1dt2 to 1stQQ6dt2. The signals 1stQQ1dt2 to 1stQQ6dt2 represent the digits of the binary number representing the position of the inverter among the inverters in the first delay circuit 10 where the logical value of any of the pulse signals in the first delay circuit 10 rises earlier than that of the corresponding pulse signal in the second delay circuit 20 for the first time.

FIG. 8B depicts the relationship between the time when the input signal INA is input and the time when the input signal INB is input when a negative time difference is measured. The input signal INA is input at T1, and the input signal INB is input is T2, which is later than T1. As a result, the inverter 11 outputs a pulse signal substantially at the time T1, and the inverter 21 similarly outputs a pulse signal substantially at the time T2.

Time T3 at which the inverter 11 produces the following pulse signal is therefore after the time T2. It is therefore possible to measure a positive time difference based on the relationship between the following pulse signal produced by the inverter 11 and the input signal INB. The negative time difference between the input signal INA and the input signal INB is calculated by subtracting the time difference between the following pulse signal produced by the inverter 11 and the input signal INB from the interval Ts between the pulse signals propagating through the first delay circuit 10.

That is, Expression (4) is used to derive the following expression:

$$TT\text{negative} = Ts - A\text{negative} \times \Delta T \qquad \text{Expression (8)}$$

That is, $$TT\text{negative} = (6k+5-6A\text{negative})Ts/(6k+6-A\text{negative}+B\text{negative}) \qquad \text{Expression (9)}$$

Further, in consideration of Expression (7), the following expression is derived:

$$TT\text{negative} = (6k+5-6A\text{negative}) \times Tref \times (6Nb+1)/Nref/(6k+6-A\text{negative}+B\text{negative}) \qquad \text{Expression (10)}$$

In Expression (10), TTnegative represents a negative time difference, and Anegative represents the position of the inverter among the inverters when the TDC circuit detects that the logical value of any of the pulse signals propagating through the first delay circuit 10 rises earlier than that of the corresponding pulse signal propagating through the second delay circuit 20 for the second time. Similarly, Bnegative represents the position of the inverter among the inverters when the TDC circuit detects that the logical value of the pulse signal propagating through the first delay circuit 10 rises earlier than that of the corresponding pulse signal propagating through the second delay circuit 20 for the third time.

The reason why Anegative or Bnegative is used to represent the position of the inverter among the inverters when the TDC circuit detects that the logical value of any of the pulse signals propagating through the first delay circuit 10 rises earlier than that of the corresponding pulse signal propagating through the second delay circuit 20 for the second or third time is as follows:

First, when the inverter 21 produces a pulse signal at the time T2, and the inverter 11 outputs a pulse signal having the logical value "H" as part of the pulse signal, the logical value of the signal Q1 output through the Q terminal of the flip-flop circuit 31 rises. The rising logical value of the signal Q1, however, does not indicate that the pulse signal in the first delay circuit 10 rises earlier than that of the pulse signal in the second delay circuit 20 as a result of propagation of the following pulse signal from the inverter 11.

It is therefore requested to ignore the signals 1stCA2, 1stCB2, and 1stQQ1dt2 to 1stQQ6dt2 latched in the detection result output circuit 140 even when the TDC circuit detects that the logical value of any of the pulse signals propagating through the first delay circuit 10 rises earlier than that of the corresponding pulse signal propagating through the second delay circuit 20 for the first time and the signal Q1 produced through the Q terminal of the flip-flop circuit 31 rises as a result of the earlier change in logical value.

The binary number expressed by the signals 2ndQQ1dt2 to 2ndQQ6dt2 therefore represents Anegative in Expression (9).

Similarly, the binary number expressed by the signals 3irdQQ1dt2 to 3irdQQ6dt2 represents Bnegative in Expression (9).

Further, the variable k described in Expression (9) may be derived by subtracting the binary number expressed by the N signals 2ndCA2 from the binary number expressed by the N signals 3irdCA2. Similarly, the variable (k+1) described in Expression (9) may be derived by subtracting the binary number expressed by the M signals 2ndCB2 from the binary number expressed by the M signals 3irdCB2. The time difference TTnegative between the time when the input signal INA is input and the time when the input signal INB is input may then be determined by actually substituting the values Anegative, Bnegative, k, and Nref and Nb determined by the detection result output circuit 140 into Expression (10).

As described above, the TDC circuit 50 according to the first embodiment and the TDC circuit 130 according to the second embodiment are similar to each other except the detection result output circuit 140.

The TDC circuit 130 includes a detection result output circuit (detection result output circuit 140), and the detection result output circuit 140 includes a first register (flip-flop circuits 139a1 to 139an, flip-flop circuits 143a1 to 143an, and flip-flop circuits 146a1 to 146a6) that stores, when the first pulse signal produced by the first inverting delay device rises earlier than the second pulse signal produced by the second inverting delay device for the second time, the count from the first counter, the count from the second counter, and the position of the second inverting delay device in the second delay circuit where the second pulse signal is produced, a second register (flip-flop circuits 138a1 to 138an, flip-flop circuits 142a1 to 142an, and flip-flop circuits 145a1 to 145a6) that stores, when the first pulse signal produced by the first inverting delay device rises earlier than the second pulse signal produced by the second inverting delay device for the third time, the count from the first counter, the count from the second counter, and the position of the second inverting delay device in the second delay circuit where the second pulse signal is produced, a third resister (flip-flop circuits 141a1 to 141an) that stores the count from the second counter when the first pulse signal produced by the first inverting delay device rises earlier than the second pulse signal produced by the second inverting delay device for the fourth time, and a counter (counter 131) that counts a reference clock input to the detection result output circuit during a period from the time when the second input signal (signal INB) is input to the time when the first pulse signal produced by the first inverting delay device rises earlier than the second pulse signal produced by the second inverting delay device for the third time and stores the count.

The negative time difference between the time when the input signal INA is input and the time when the input signal INB is input may be calculated based on the following information stored in the detection result output circuit: "the count from the first counter and the count from the second counter at the time of second earlier rise, and the position of the second inverting delay device in the second delay circuit where the second pulse signal is produced at the time of second earlier rise," "the count from the first counter and the count from the second counter at the time of third earlier rise, and the position of the second inverting delay device in the second delay circuit where the second pulse signal is produced at the time of third earlier rise," and "the count of the reference clock input to the detection result output circuit at the time of fourth earlier rise."

The TDC circuit according to the first embodiment may be configured to output a digital signal by adding a circuit that digitizes values associated with the time difference determined based on the output signal from the TDC circuit 50. An ADPLL (all digital phase locked loop) may be configured by using the resultant TDC circuit.

FIG. 9 is a circuit diagram of an ADPLL 200 according to a third embodiment. The ADPLL 200 includes an accumulator 210, a mixer/phase comparator 220, a loop filter 230, a DCO (digitally controlled oscillator) 240, a TDC circuit 250, and a counter 260.

The accumulator 210 accumulates frequency setting word signals 211 in response to a reference clock 251 and outputs a digital signal representing a reference phase according to the voltage of the accumulated signal. Each of the frequency setting word signals 211 has a voltage associated with the oscillatory frequency of the DCO 240.

The mixer/phase comparator 220 outputs a phase error signal for controlling the oscillatory frequency of an output signal from the DCO 240 to the loop filter 230. The phase error signal is determined in accordance with a digital signal representing the difference between the reference phase expressed by the output signal from the TDC circuit 250 and the phase of the output signal from the DCO 240, a digital signal provided from the counter 260 and representing the phase of the output signal from the DCO 240, and a signal representing the reference phase.

The loop filter 230 removes harmonic components and noise contained in the phase error signal and outputs a control signal to the DCO 240 in consideration of the control sensitivity of the DCO 240.

The counter 260 detects the phase of the output signal from the DCO 240 and outputs a digital signal according to the phase of the output signal from the DCO 240 to the mixer/phase comparator 220.

The TDC circuit 250 compares the phase of the rising edge of the reference clock 251 with the phase of the rising edge of the output signal from the DCO 240 and outputs a digital signal according to the phase difference to the mixer/phase comparator 220, that is, detects the time difference between the rising edge of the reference clock 251 and the rising edge of the output signal from the DCO 240 and outputs a digital signal according to the time difference to the mixer/phase comparator 220.

The TDC circuit 250 is formed of the TDC circuit 50 according to the first embodiment and a circuit that digitizes a result provided from the TDC circuit 50. The TDC circuit 250 therefore outputs a digital signal corresponding to the binary digits that express values associated with the time difference obtained by Expression (6) using the signals Nref, 1stCA, 2ndCA, 3irdCB, 2ndCB, 1stCB, 2ndQQ1dt to 2ndQQ6dt, and 1stQQ1dt to 1stQQ6dt provided from the TDC circuit 50 according to the first embodiment.

The ADPLL circuit 200 according to the third embodiment described above includes an oscillatory circuit (DCO 240) that outputs an oscillatory signal having an oscillatory frequency according to an input digital signal, an accumulator that accumulates frequency setting words and outputs a signal representing a reference phase, a phase difference detection circuit (TDC circuit 250) that compares the phase of the oscillatory signal with the phase of a reference clock and outputs a digital signal according to the phase difference, a counter that detects the phase of the oscillatory signal output from the oscillatory circuit and outputs a signal obtained by digitizing the phase, a phase comparator that outputs a signal for controlling the oscillatory frequency produced in the oscillatory circuit in accordance with the digital signal according to the phase difference output from the phase difference detection circuit and a signal obtained by digitizing the phase of the oscillatory signal output from the oscillatory circuit, and a filter circuit that removes harmonic components contained in the control signal output from the phase comparator and outputs a control signal to the oscillatory circuit, the control signal obtained by changing the control signal output from the phase comparator in accordance with control sensitivity of the oscillatory circuit.

The TDC circuit 50 according to the first embodiment may precisely detect the difference in phase between the reference clock and the oscillatory signal from the oscillator (DCO 240), that is, the time difference between a logical value rising edge and a logical value falling edge. Further, using the TDC circuit 50 according to the first embodiment allows an ADPLL formed of all-digital PLL circuits to be configured. In the resultant ADPLL, since the DCO 240 controlled by a digital signal provides an oscillatory signal, phase noise in the DCO 240 is suppressed. The reason for this is that any variation in delay resulting from analog circuits is eliminated, whereby variation in producing and transferring signals is suppressed. Therefore, the amount of phase noise, which affects an oscillatory signal output from the ADPLL, that is, the clock obtained by dividing the reference clock, is advantageously reduced.

According to the present invention, a TDC circuit that is formed of a relatively small-scale circuit for detecting a time difference between two pulse signals with high resolution is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A time-to-digital converter (TDC) circuit, comprising:
a first delay circuit configured to include an even number of first inverting delay devices connected in series to form a loop, each of the first inverting delay devices outputting a signal having a logical value inverted from the logical value of an input signal after a first signal delay period;
a second delay circuit configured to include the same even number of second inverting delay devices connected in series to form a loop as that of the first inverting delay devices, each of the second inverting delay devices outputting a signal having a logical value inverted from the logical value of an input signal after a second signal delay period different from the first signal delay period;
a first pulse signal drive circuit configured to receive a first input signal and cause any of the first inverting delay devices to produce a first pulse signal;
a second pulse signal drive circuit configured to receive a second input signal and cause any of the second inverting delay devices to produce a second pulse signal;
a plurality of first flip-flop circuits configured to latch the logical values of third pulse signals including the first pulse signal output from the first inverting delay devices corresponding to the second inverting delay devices or pulse signals produced by the first inverting delay devices in response to the first pulse signal based on fourth pulse signals including the second pulse signal or pulse signals produced by the second inverting delay devices in response to the second pulse signal;
a first counter configured to count the third pulse signal produced by any one of the first inverting delay devices;
a second counter configured to count the fourth pulse signal produced by any one of the second inverting delay devices; and
a detection result output circuit configured to store a first count from the first counter and a second count from the second counter when the plurality of first flip-flop circuits latch the third pulse signals based on the fourth pulse signals and the logical value of the signal latched by any of the plurality of first flip-flop circuits undergoes a first change.

2. The TDC circuit according to claim 1, further comprising:
a plurality of second flip-flop circuits configured to receive an output from one of the plurality of first flip-flop circuits through CLK terminals and receive an output from one of the other first flip-flop circuits through D terminals.

3. The TDC circuit according to claim 1, wherein each of the first inverting delay devices, the second inverting delay devices, the plurality of first flip-flop circuits, and the plurality of second flip-flop circuits is driven by complementary signals.

4. The TDC circuit according to claim 1, wherein the first inverting delay device that produces the first pulse signal has a reset terminal and outputs a signal having a fixed logical value when a signal having a logical value "L" is input to the reset terminal irrespective of the logical values of signals input to the first inverting delay device,
the first pulse signal drive circuit inputs a signal having the logical value "L" to the reset terminal of the first inverting delay device that produces the first pulse signal when the first input signal is input to the first pulse signal drive circuit, and
the pulse signal produced by the first inverting delay device that produces the first pulse signal propagates through one-half the first inverting delay devices, which are connected to form the loop, and the first pulse signal drive circuit inputs a signal having a logical value "H" to the reset terminal of the first inverting delay device that produces the first pulse signal in response to the third pulse signal having propagated through the one-half the first inverting delay devices.

5. The TDC circuit according to claim 1,
wherein the detection result output circuit includes a first register that stores, when the first change occurs for the first time, the first count from the first counter, the second count from the second counter, and the position of the second inverting delay device in the second delay circuit where the second pulse signal or the fourth pulse signal is produced,
a second register that stores, when the first change occurs for the second time, the first count from the first counter, the second count from the second counter, and the position of the second inverting delay device in the second delay circuit where the second pulse signal or the fourth pulse signal is produced, a third resister that stores the second count from the second counter when the first change occurs for the third time, and a counter that counts a reference clock input to the detection result output circuit during a period from the time when the second input signal is input to the time when the first change occurs for the third time and stores the count.

6. The TDC circuit according to claim 1,
wherein the detection result output circuit includes a first register that stores, when the first change occurs for the second time, the first count from the first counter, the second count from the second counter, and the position of the second inverting delay device in the second delay circuit where the second pulse signal or the fourth pulse signal is produced, a second register that stores, when the first change occurs for the third time, the first count from the first counter, the second count from the second counter, and the position of the second inverting delay device in the second delay circuit where the second pulse signal and the fourth pulse signal are produced, a third resister that stores the second count from the second counter when the first change occurs for the fourth time, and a counter that counts a reference clock input to the detection result output circuit during a period from the time when the second input signal is input to the time when the first change occurs for the fourth time and stores the count.

7. An all digital phase locked loop (ADPLL) circuit, comprising:

an oscillatory circuit configured to output an oscillatory signal having an oscillatory frequency according to an input digital signal;

an accumulator configured to accumulate frequency setting words and outputs a signal representing a reference phase;

a phase difference detection circuit configured to compare the phase of the oscillatory signal with the phase of a reference clock and output a digital signal according to the phase difference;

a counter configured to detect the phase of the oscillatory signal output from the oscillatory circuit and output a digital signal representing the phase;

a phase comparator configured to output a signal for controlling the oscillatory frequency produced in the oscillatory circuit in accordance with the digital signal according to the phase difference output from the phase difference detection circuit and a signal obtained by digitizing the phase of the oscillatory signal output from the oscillatory circuit; and a filter circuit configured to remove harmonic components contained in the control signal output from the phase comparator and output a control signal to the oscillatory circuit, the control signal being obtained by changing the control signal output from the phase comparator in accordance with control sensitivity of the oscillatory circuit, wherein the phase difference detection circuit includes:
a first delay circuit having an even number of first inverting delay devices connected in series to form a loop, each of the first inverting delay devices outputting a signal having a logical value inverted from the logical value of an input signal after a first signal delay period;

a second delay circuit having the same even number of second inverting delay devices connected in series to form a loop as that of the first inverting delay devices, each of the second inverting delay devices outputting a signal having a logical value inverted from the logical value of an input signal after a second signal delay period different from the first signal delay period;

a first pulse signal drive circuit configured to receive a first input signal and cause any of the first inverting delay devices to produce a first pulse signal;

a second pulse signal drive circuit configured to receive a second input signal and cause any of the second inverting delay devices to produce a second pulse signal;

a plurality of first flip-flop circuits configured to latch the logical values of third pulse signals including the first pulse signal output from the first inverting delay devices corresponding to the second inverting delay devices or pulse signals produced by the first inverting delay devices in response to the first pulse signal based on fourth pulse signals including the second pulse signal or pulse signals produced by the second inverting delay devices in response to the second pulse signal;

a first counter configured to count the third pulse signal produced by any one of the first inverting delay devices;

a second counter configured to count the fourth pulse signal produced by any one of the second inverting delay devices; and a detection result output circuit configured to store a first count from the first counter and a second count from the second counter when the plurality of first flip-flop circuits latch the third pulse signals based on the fourth pulse signals and the logical value of the signal latched by any of the plurality of first flip-flop circuits undergoes a first change.

8. The ADPLL circuit according to claim 7, wherein the phase difference detection circuit further includes:
a plurality of second flip-flop circuits configured to receive an output from one of the plurality of first flip-flop circuits through CLK terminals and receive an output from one of the other first flip-flop circuits through D terminals.

9. The ADPLL circuit according to claim 7,
wherein each of the first inverting delay devices, the second inverting delay devices, the plurality of first flip-flop circuits, and the plurality of second flip-flop circuits is driven by complementary signals.

10. The ADPLL circuit according to claim 7,
wherein the first inverting delay device that produces the first pulse signal has a reset terminal and outputs a signal having a fixed logical value when a signal having a logical value "L" is input to the reset terminal irrespective of the logical values of signals input to the first inverting delay device, the first pulse signal drive circuit inputs a signal having the logical value "L" to the reset terminal of the first inverting delay device that produces the first pulse signal when the first input signal is input to the first pulse signal drive circuit, and the pulse signal produced by the first inverting delay device that produces the first pulse signal propagates through one-half the first inverting delay devices, which are connected to form the loop, and the first pulse signal drive circuit inputs a signal having a logical value "H" to the reset terminal of the first inverting delay device that produces the first pulse signal in response to the third pulse signal having propagated through the one-half the first inverting delay devices.

11. The ADPLL circuit according to claim 7,
wherein the detection result output circuit includes a first register that stores, when the first change occurs for the first time, the first count from the first counter, the second count from the second counter, and the position of the second inverting delay device in the second delay circuit where the second pulse signal or the fourth pulse signal is produced,
a second register that stores, when the first change occurs for the second time, the first count from the first counter, the second count from the second counter, and the position of the second inverting delay device in the second delay circuit where the second pulse signal or the fourth pulse signal is produced,
a third resister that stores the second count from the second counter when the first change occurs for the third time, and
a counter that counts a reference clock input to the detection result output circuit during a period from the time when the second input signal is input to the time when the first change occurs for the third time and stores the count.

12. The ADPLL circuit according to claim 7,
wherein the detection result output circuit includes a first register that stores, when the first change occurs for the second time, the first count from the first counter, the second count from the second counter, and the position of the second inverting delay device in the second delay circuit where the second pulse signal or the fourth pulse signal is produced,
a second register that stores, when the first change occurs for the third time, the first count from the first counter, the second count from the second counter, and the position of the second inverting delay device in the second delay circuit where the second pulse signal and the fourth pulse signal are produced,
a third resister that stores the second count from the second counter when the first change occurs for the fourth time, and
a counter that counts a reference clock input to the detection result output circuit during a period from the time when the second input signal is input to the time when the first change occurs for the fourth time and stores the count.

* * * * *